United States Patent [19]
Richard et al.

[11] Patent Number: 5,543,354
[45] Date of Patent: Aug. 6, 1996

[54] METHOD OF FABRICATING A QUANTUM DOT STRUCTURE ON A (N11) SUBSTRATE

[75] Inventors: Nötzel Richard, Sapporo; Temmyo Jiro, Kanagawa; Tamamura Toshiaki, Kanagawa; Sugo Mitsuru, Kanagawa; Kuramochi Eiichi, Kanagawa; Nishiya Teruhiko, Kanagawa, all of Japan

[73] Assignee: Nippon Telegraph and Telephone Corporation, Tokyo, Japan

[21] Appl. No.: 347,778

[22] Filed: Nov. 30, 1994

[30] Foreign Application Priority Data

Nov. 25, 1993 [JP] Japan .................................. 5-317544
Dec. 22, 1993 [JP] Japan .................................. 5-345583
Sep. 16, 1994 [JP] Japan .................................. 6-221455

[51] Int. Cl.$^6$ ................................................ H01L 21/20
[52] U.S. Cl. .......................... 437/129; 437/126; 437/132; 437/133
[58] Field of Search .................................. 437/126, 129, 437/133, 132

[56] References Cited

U.S. PATENT DOCUMENTS

| 4,122,407 | 10/1978 | Vechten | 437/93 |
| 5,079,774 | 1/1992 | Mendez et al. | 372/45 |
| 5,363,395 | 11/1994 | Gaines et al. | 372/45 |

FOREIGN PATENT DOCUMENTS

| 0535293A1 | 4/1993 | European Pat. Off. . |
| 63-94230 | 9/1988 | Japan . |

OTHER PUBLICATIONS

M. Tanaka, H. Sakaki, J. Yoshino and T. Furuta, "Photoluminescence and Absorption Linewidth of Extremely Flat GaAs–AlAs Quantum Wells Prepared by Molecular Beam Epitaxy Including Interrupted Deposition for Automatic Layer Smoothing", Surface Science 174(1986), North–Holland, Amsterdam, pp. 65 and 69.

*Primary Examiner*—R. Bruce Breneman
*Assistant Examiner*—Ramamohan Rao Paladugu
*Attorney, Agent, or Firm*—Townsend and Townsend and Crew; Kenneth R. Allen

[57] ABSTRACT

A semiconductor structure includes a first semiconductor barrier layer formed on a compound semiconductor substrate, a semiconductor carrier confinement layer formed on the semiconductor barrier layer, and a second semiconductor barrier layer arranged on the semiconductor carrier confinement layer. The semiconductor carrier confinement layer includes a plurality of islands spaced apart from each other and having an almost equal thickness, and a thin quantum well film arranged between the islands and having a thickness smaller than the thickness of the islands.

4 Claims, 21 Drawing Sheets

↓MAGNIFIED

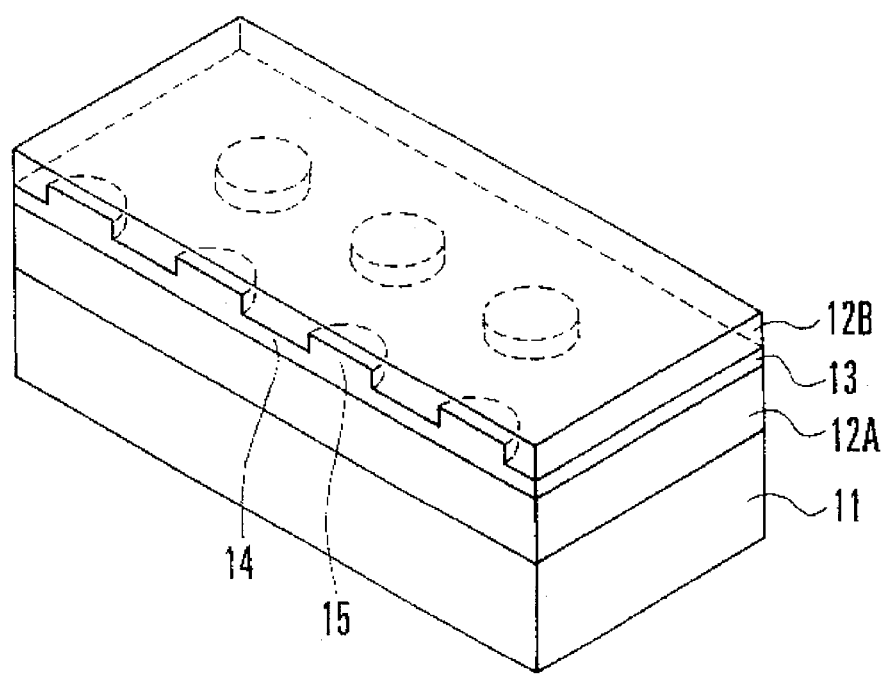
F I G. 1
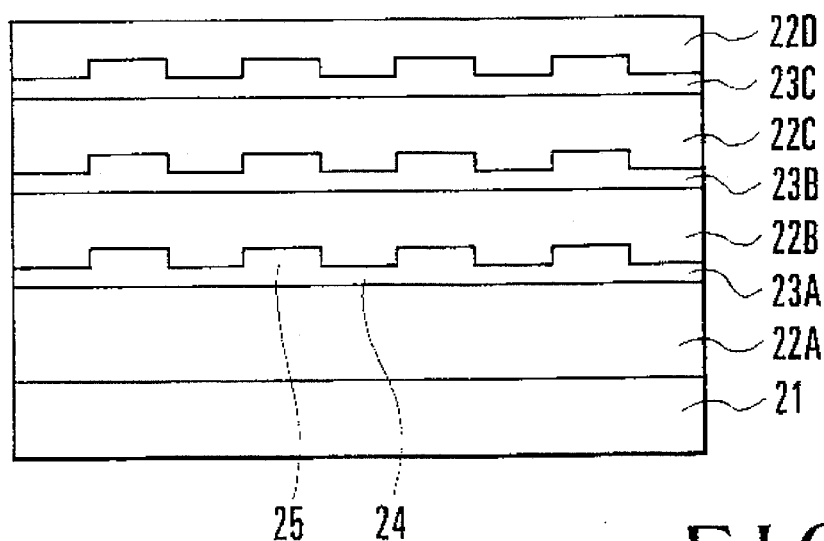
F I G. 2

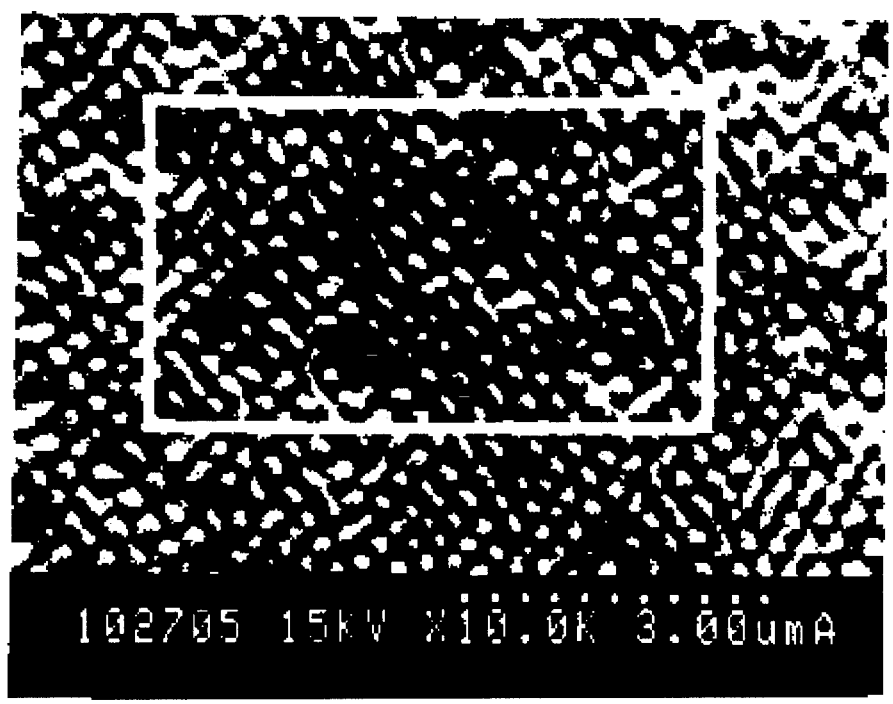
MAGNIFIED  3μm
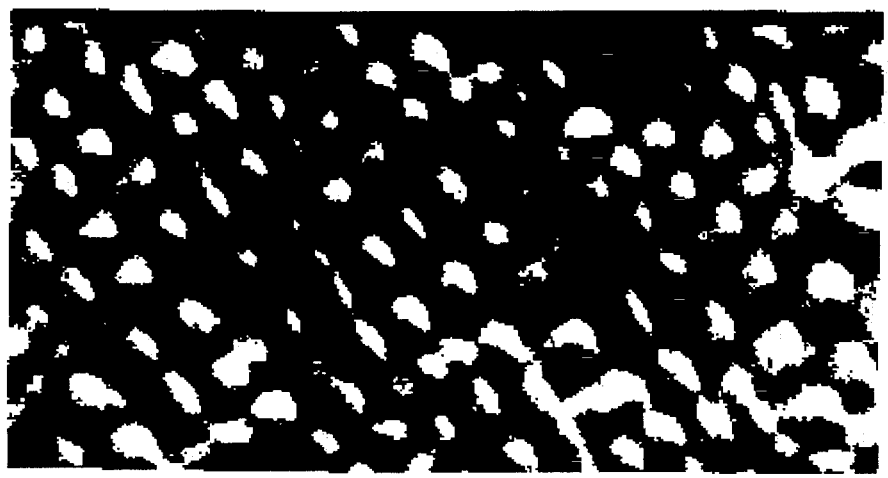
F I G. 5

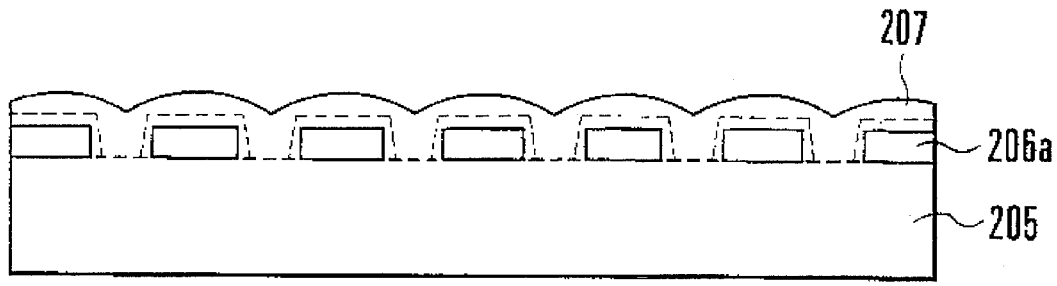
F I G. 21A
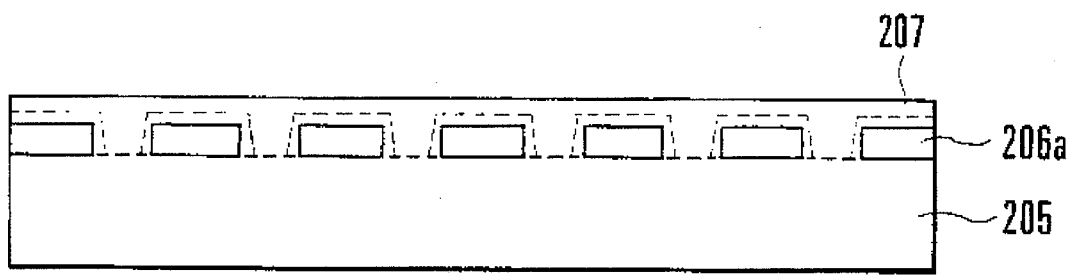
F I G. 21B

METHOD OF FABRICATING A QUANTUM DOT STRUCTURE ON A (N11) SUBSTRATE

BACKGROUND OF THE INVENTION

The present invention relates to a semiconductor structure and a method of fabricating the same and, more particularly, to an island region for a semiconductor device and a method of fabricating the same.

It is pointed out that, when the size of a semiconductor heterostructure is several tens nm or less, which is equal to or smaller than the de Broglie wavelength of carriers (electrons and holes) in a semiconductor crystal, a quantum containment effect is appeared, which is not observed in a bulk crystal.

This is because the carriers are localized in such a small semiconductor heterostructures.

Bulk crystal illustrated in FIG. 27A has the function of the density of states of carriers which is continuous with the carrier energy as shown in FIG. 27B. This situation is shown in FIG. 27A. In a semiconductor with a quantum well film structure shown in FIG. 27C, the density of states of carriers has a stepwise Junction against energy as in FIG. 27D. In a semiconductor with a quantum well film wire structure in FIG. 27E, the density of states of carriers should have a spike form function against energy in FIG. 27F. In a semiconductor with a quantum box structure shown in FIG. 27G, the density of states of carriers should have completely a discrete function as in FIG. 27H.

Because of the recent advances of crystal growth technologies, a thin high-quality semiconductor film or multi-layer films formed by stacking this thin film can be easily fabricated as two-dimensional quantum well films. In these quantum films, an emission spectrum whose full-width half maximum is narrower than hat of a bulk crystal is obtained, and unique physical properties, such as high optical gain and the generation of excitons at room temperature, are observed, due to their localized density of states.

Using these quantum effects, the characteristics of semiconductor lasers or various optical devices such as optical modulators and optical switches have been significantly improved.

By taking into account the success of the introduction of these quantum well film structures, the fabrication and physical property of further localized structures such as quantum wires or quantum boxes are extensively studied at present.

Various methods for the fabrication of a quantum wire structure or the quantum box structure have been proposed. The most conventional method is to form fine patterns on a two-dimensional quantum well film by using electron beam lithography, and these patterns are transferred into a quantum film by etching. The other method is focused ion beam lithography, which can directly form wires or boxes.

In both methods, thin semiconductor films are formed by controlling the compositions and thickness precisely by using epitaxial growth technologies. Thereafter, the size in the lateral direction is controlled by, lithography and/or etching of quantum wires or quantum boxes. Therefore, the minimum size and size uniformity size of the structure in the lateral direction is severely limited by the accuracy of the process technologies used.

Recently, several attempts in which a carrier confined region is formed by using growth technology such as MOVPE (Metal Organic Vapor Phase Epitaxy) or MBE (Molecular Beam Epitaxy) have been reported. These methods make use of the chemical properties of crystal growth. That is, when a thin film is grown on a substrate crystal which is subjected to certain processing, stable facet surfaces appear in a crystal with a three-dimensional structure depending on the growth conditions and the growth methods. A multi-dimensionally confined structure can obtained by the successive Growth of several kinds of epitaxial layers under the different conditions.

The characteristic feature of this method is that the damage and contamination to the carrier confined region caused by the lithographic process can be eliminated.

In order to fabricate quantum wires and quantum boxes using epitaxial growth technology, the selective area growth which semiconductor surface is covered with patterned passivation films has been frequently used, and a wire is grown in the opening of passivation films.

Other examples of conventionally known methods are one in which facets are formed on a crystal face having the shape of a V-shaped groove and a wire structure is formed on the bottom of this V-shaped groove, and one in which a wire structure is formed in the longitudinal direction on the basis of steps formed on a tilted substrate.

As a quantum well film box structure which aims to realize a O-dimensional electron-hole system, a tetrahedral quantum well film box structure is examined, which is fabricated by, e.g., forming an AlGaAs epitaxial film on a (111)B GaAs substrate by performing MOVPE selective-area growth using $SiO_2$ as a mask.

Unfortunately, in these wire and box structures, it is necessary to form a one-dimensional or two-dimensional structure of several tens nm size not only in the direction of film thickness but in the plane of a thin quantum well film. Therefore, the quality of a crystal degrades more easily than a thin quantum well film. This makes it difficult to realize a quantum wire or a quantum box with optical characteristics comparable to or better than to those of a quantum well film.

In the case of selective growth method, a short diffusion length of Al causes a large selective mask dependence on the thickness and composition of an AlGaAs epitaxial film. This makes the formation of ultra-fine box structure difficult. Also, there are additional problems that the spatial density of the quantum well film boxes is limited by the fabrication processes of a selective mask and this selective mask must be removed in the fabrication of a device (semiconductor device).

As a method of obtaining a multiple quantum wire structure, a (110) cleaved surface of a periodic structure of GaAs/AlGaAs grown on a flat GaAs is used for the growth substrate by using semiconductor epitaxial growth of GaAs/AlGaAs structure quantum wire surface as tile cleavage plane. In this method, the selective growth of GaAs occurs due to a spontaneous oxide film firmed on underlying AlGaAs with a heavily doped Al composition. Consequently, it is possible to realize a multiple GaAs/AlGaAs quantum wire structure of which dimension is defined by the underlying periodic structure of GaAs/AlGaAs.

In this method, however, the formation of electrodes or the like must be performed in a narrow region because the cleavage plane of a crystal is used. Therefore, it is difficult to fabricate useful optical devices using this method.

On the other hand, as a method of forming a quantum well film box structure on a plain semiconductor substrate by using only vapor phase crystal growth, the formation of island-like InP on a GaAs substrate is reported. Since the lattice constant of InP is largely different from that of GaAs, InP is not formed as a film but randomly aggregates into islands on a GaAs substrate.

Unfortunately, a large variation in island size is inevitable in this method. In addition, it is difficult to obtain high density islands because the increase in the amount of InP causes the crystal defect in islands. Therefore, the limited density of island-like InP formable makes the fabrication of optical device on a practical level difficult.

SUMMARY OF THE INVENTION

It is therefore a principal object of the present invention to provide a semiconductor structure and a method of fabricating the same, which can form fine, high-density island regions containing a carrier confinement layer.

It is another object of the present invention to achieve the above principal object and provide an optical modulator with sharp exciton absorption characteristics.

It is still another object of the present invention to achieve the above principal object and provide a semiconductor laser improved in characteristics compared to conventional semiconductor lasers.

To achieve the above objects, according to one aspect of the present invention, there is provided a semiconductor structure comprising a first semiconductor barrier layer formed on a compound semiconductor substrate, a semiconductor carrier confinement layer formed on the semiconductor barrier layer, and a second semiconductor barrier layer arranged on the semiconductor carrier confinement layer, wherein the semiconductor carrier confinement layer comprises a plurality of islands spaced apart from each other and having an almost equal thickness, and a thin quantum well film arranged between the islands and having a thickness smaller than the thickness of the islands.

According to another aspect of the present invention, there is provided a semiconductor structure comprising a first semiconductor barrier layer formed on a compound semiconductor substrate comprising a III–V compound semiconductor and having an (n11)B surface (n= 2, 3, 4, 5, 6, or 7) as a major surface, a semiconductor carrier confinement layer formed on the semiconductor barrier layer (12A), and a second semiconductor barrier layer arranged on the semiconductor carrier confinement layer, wherein the semiconductor carrier confinement layer comprises a plurality of islands spaced apart from each other and having an almost equal thickness.

According to still another aspect of the present invention, there is provided a semiconductor structure comprising a substrate comprising a III–V compound semiconductor and having an (n11)B surface (n=2, 3, 4, 5, 6, or 7) as a major surface, a first semiconductor barrier layer formed on the substrate, a semiconductor carrier confinement layer formed on the semiconductor barrier layer, a second semiconductor barrier layer arranged on the semiconductor carrier confinement layer, and a semiconductor carrier blocking layer and an optical waveguiding layer formed on the second semiconductor barrier layer, wherein the semiconductor carrier confinement layer comprises a plurality of islands spaced apart from each other and having an almost equal thickness, and the islands are surrounded by barrier layers formed above and below the islands.

According to still another aspect of the present invention, there is provided a method of fabricating a semiconductor structure, comprising the first step of forming a first semiconductor barrier layer on a substrate having an (n11)B surface (n=2, 3, 4, 5, 6, or 7) as a major surface and comprising a III–V compound semiconductor by using vapor phase crystal growth, the second step of forming a strained quantum well film with lattice mismatch on the semiconductor barrier layer by vapor phase crystal growth, the third step of interrupting the growth of the strained quantum well film for a predetermined time after the second step to facilitate the transfer of the strained quantum well film layer to island regions, thereby forming a carrier confinement layer having an island structure consisting of a plurality of islands with a relatively large film thickness on the strained quantum well film, and the fourth step of forming a second semiconductor barrier layer on the carrier confinement layer by vapor phase crystal growth.

According to still another aspect of the present invention, there is provided a method of fabricating a semiconductor structure, comprising the first step of forming a semiconductor barrier layer on a substrate having an (n11)B surface (n=2, 3, 4, 5, 6, or 7) as a major surface and comprising a III–V compound semiconductor by using vapor phase crystal growth, the second step of forming a strained quantum well film layer with lattice mismatch on the semiconductor barrier layer by vapor phase crystal growth, the third step of interrupting the growth of the strained quantum well film layer after the second step to facilitate the transfer of the strained quantum well film layer to island regions and the semiconductor barrier layer below the strained quantum well film layer, thereby forming a semiconductor carrier confinement layer having an island structure in which the strained quantum well film layer breaks up into a plurality of islands and the islands are completely surrounded by the semiconductor barrier layer, and the fourth step of forming a second barrier layer on the semiconductor carrier confinement layer by vapor phase crystal growth subsequently to the third step.

According to still another aspect of the present invention, there is provided an optical modulator comprising a substrate comprising a III–V compound semiconductor, a buffer layer formed on the substrate, a lower cladding layer formed on the buffer layer, a lower waveguiding layer formed on the lower cladding layer, a semiconductor carrier blocking layer formed on the lower waveguiding layer, a semiconductor carrier confinement layer formed in the semiconductor carrier blocking layer, a semiconductor barrier layer formed on the carrier confinement layer, a semiconductor carrier blocking layer and an optical waveguiding layer formed on the semiconductor barrier layer, an upper cladding layer formed on the waveguiding layer, a ridge-like contact layer formed on the upper cladding layer, a first electrode arranged on top of the contact layer, and a second electrode arranged on a lower surface of the substrate, wherein the semiconductor carrier confinement layer comprises a plurality of islands spaced apart from each other, and a thin quantum well film arranged between the islands and having a thickness smaller than a film thickness of the islands.

According to still another aspect of the present invention, there is provided an optical modulator comprising a substrate comprising a III–V compound semiconductor and having an (n11)B surface (n=2, 3, 4, 5, 6, or 7) as a major surface, a buffer layer formed on the substrate, a lower cladding layer formed on the buffer layer, a lower waveguiding layer formed on the lower cladding layer, a semiconductor carrier blocking layer formed on the lower waveguiding layer, a semiconductor carrier confinement layer formed in the semiconductor carrier blocking layer, a semiconductor barrier layer formed on the semiconductor carrier confinement layer, a semiconductor carrier blocking layer and an optical waveguiding layer formed on the semiconductor barrier layer, an upper cladding layer formed on the waveguiding layer, a ridge-like contact layer formed on the upper cladding layer, a first electrode arranged on top of the contact layer, and a second electrode arranged on a lower surface of the substrate, wherein the semiconductor carrier confinement layer comprises a plurality of islands spaced apart from each other.

According to still another aspect of the present invention, there is provided a semiconductor laser comprising a substrate comprising a III–V compound semiconductor, a buffer layer formed on the substrate, a lower cladding layer formed on the buffer layer, a lower waveguiding layer formed on the lower cladding layer, a semiconductor carrier blocking layer formed on the lower waveguiding layer, a semiconductor carrier confinement layer formed in the semiconductor carrier blocking layer, a semiconductor carrier blocking layer and an optical waveguiding layer formed on the semiconductor carrier confinement layer, an upper cladding layer formed on the waveguiding layer, a ridge-like contact layer formed on the upper cladding layer, a first electrode arranged on top of the contact layer, and a second electrode arranged on a lower surface of the substrate, wherein the semiconductor carrier confinement layer comprises a plurality of islands spaced apart from each other, and a thin quantum well film arranged between the islands and having a thickness smaller than a film thickness of the islands.

According to still another aspect of the present invention, there is provided a semiconductor laser comprising a substrate comprising a III–V compound semiconductor and having an (n11)B surface (n=2, 3, 4, 5, 6, or 7) as a major surface, a buffer layer formed on the substrate, a lower cladding layer formed on the buffer layer, a lower waveguiding layer formed on the lower cladding layer, a semiconductor barrier layer formed on the lower waveguiding layer, a semiconductor carrier confinement layer formed in the semiconductor barrier layer, a semiconductor carrier blocking layer and an optical waveguiding layer formed on the semiconductor carrier confinement layer, an upper cladding layer formed on the waveguiding layer, a ridge-like contact layer formed on the upper cladding layer, a first electrode arranged on top of the contact layer, and a second electrode arranged on a lower surface of the substrate, wherein the semiconductor carrier confinement layer comprises a plurality of islands spaced apart from each other.

BRIEF DESCRIPTION OF THE DRAWINGS

FIG. 1 is a perspective view showing the basic sectional structure of a semiconductor quantum structure as a semiconductor structure according to the present invention;

FIG. 2 is a sectional view showing the state of a multiple structure obtained by developing the semiconductor quantum structure in FIG. 1;

FIG. 5 is an electron micrograph representing fine islands formed on a substrate;

FIGS. 21A and 21B are views schematically showing the sectional shapes of the film when the Al compositions of a semiconductor carrier blocking layer and an optical guide layer are changed in Example 49;

DETAILED DESCRIPTION OF THE PREFERRED EMBODIMENTS

Figure 3A:
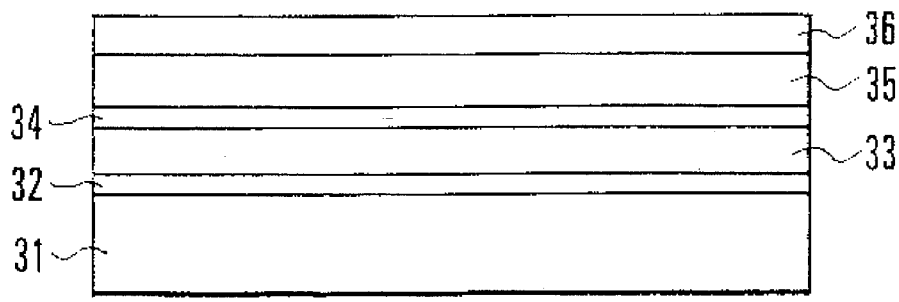
FIGS. 3A to 3C are sectional views showing the steps of a method of forming the semiconductor quantum structure of the present invention.

Prior to explaining the embodiments of the present invention, the basic structure of a semiconductor structure according to the present invention will be described below with reference to the accompanying drawings.

FIG. 1 is a perspective view showing the basic structure of a semiconductor quantum structure as the semiconductor structure of the present invention. In FIG. 1, reference numeral 11 denotes a semiconductor substrate; 12A and 12B, semiconductor barrier layers formed on the semiconductor substrate 11; 13, a carrier confinement layer so formed as to be sandwiched between the semiconductor barrier layers 12A and 12B; 14, a thin strained quantum well film constituting the carrier confinement layer 13; and 15, fine islands constituting the carrier confinement layer 13 and having a film thickness larger than that of the strained quantum well film 14.

The semiconductor quantum structure illustrated in FIG. 1 is a novel low-dimensional semiconductor quantum structure in which both a two-dimensional quantum well film structure and a 0-dimensional quantum box structure exist. In addition, this semiconductor quantum structure exhibits unique optical characteristics which are not found in conventional quantum structures; i.e., intense luminescence with a narrow full-width half maximum is observed.

FIG. 2 shows a structure obtained by developing the semiconductor quantum structure in FIG. 1. In FIG. 2, the combined structure of semiconductor barrier layers and carrier confinement layers formed on a semiconductor substrate 21 is different from FIG. 1. In FIG. 2, this combined structure has a multi-layer (3-layer) arrangement constituted by semiconductor barrier layers 22A, 22B, 22C, and 22D and carrier confinement layers 23A, 23B, and 23C formed between these barrier layers. In other words, in the state shown in FIG. 2, each of the carrier confinement layers 23A, 23B, and 23C has an arrangement in which a large number of islands 25 are distributed in a strained quantum well film 24. Three carrier confinement layers with this arrangement and the semiconductor barrier layers described above are alternately combined to form the overall structure.

The structures shown in FIGS. 1 and 2 are the basic structures of the present invention. To improve the optical characteristics, layers that are normally used in the fabrication of a thin quantum well film, e.g., an appropriate buffer layer, a barrier layer with different composition or different thickness, or a cap layer is sometime added to the above structures.

According to the examinations made by the present inventors, the semiconductor quantum well film structures of the present invention are realized by the combination of a specific semiconductor substrate, semiconductor barrier layers, and semiconductor carrier confinement layers. The semiconductor substrate used in the present invention consists of a III–V compound semiconductor, such as GaAs or InP, whose major surface is the (n11)B (wherein n=2, 3, 4, 5, 6, or 7) surface. Microscopically, this (n11)B surface consists of the (100) surface on which smooth epitaxial growth readily takes place and the (111)B surface which is the Group-V stabilized surface such as the As surface and on which the growth can hardly occur. Therefore, vapor phase crystal growth taking place on this (n11)B surface exhibits the unusual characteristics discussed above.

In the case of (n11)B GaAs substrates, for example, the above unique characteristic was found when the semiconductor carrier confinement layers were constructed from strained $In_zGa_{1-z}As$ and the semiconductor barrier layers were constructed from $Al_yGa_{1-y}As$ or when the semiconductor carrier confinement layers were constructed from strained $GaAs_zSb_{1-z}$ and the semiconductor barrier layers were constructed from $Al_yGa_{1-y}As$.

On the other hand, in the case of (n11)B InP substrates, the identical unique characteristics were found when the semiconductor carrier confinement layers were made from strained $In_z Ga_{1-z}As$ and the semiconductor barrier layers were made from $In_zAl_yGa_{1-z-y}As$ or when the semiconductor carrier confinement layers were made from strained $In_xGa_{1-x}As_xSb_{1-z}$ and the semiconductor barrier layers were made from $In_yAl_{1-y}As$.

Figure 3B:
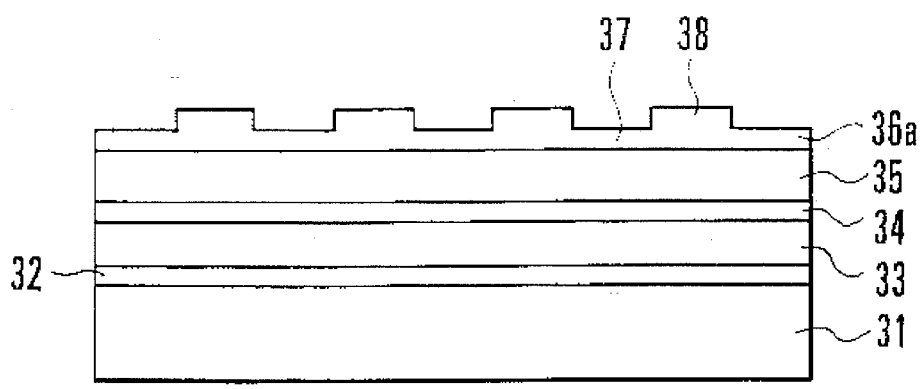
Figure 3C:
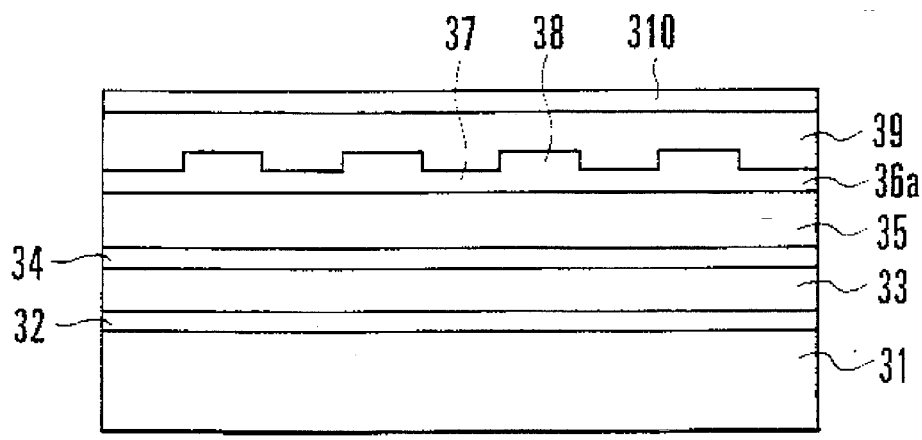

FIGS. 3A to 3C are sectional views showing the method of forming the semiconductor quantum structure according to the present invention. This basic semiconductor quantum well film formation method will be described below.

First, as illustrated in FIG. 3A, a semiconductor buffer layer 32, a semiconductor barrier layer 33, a strained quantum well (SQw) film layer 34, a semiconductor barrier layer 35, and a carrier confinement layer 36 consisting of a thin strained quantum well film are formed in this order on a high-index-number substrate 31 having the (n11)B surface as its major surface.

As in FIG. 3A, immediately after the growth of these layers, the carrier confinement layer 36 is in the form of the strained quantum well film. However, as illustrated in FIG. 3B, after a proper growth interruption time, a portion of the carrier confinement layer 36 changes into a carrier confinement layer 36a which consists of a thin strained quantum well film 37 with a relatively small film thickness and fine islands 38 distributed in this thin film and having a relatively large film thickness.

Thereafter, as shown in FIG. 3C, a semiconductor barrier layer 39 and a semiconductor cap layer 310 are formed in sequence on the carrier confinement layer 36a, yielding a flat-surface structure.

In this structure, the role of the strained quantum well film layer 34 is not so essential in the present invention. Therefore, the effect of the present invention is sufficiently achieved even if this layer 34 is not formed. However, when the strained quantum well film layer 34 is inserted as in this embodiment, the sizes of the islands tend to become uniform in the formation of optical semiconductor device island regions of the present invention (to be described later).

No such an island structure is formed if a conventional quantum well film having no strain is used as the semiconductor carrier confinement layer. Therefore, it is estimated that the strain energy of the strained quantum well film contributes to the formation of this island structure.

In the above embodiment, the islands are distributed in the thin quantum well film. Even when identical strained quantum well films are used, in some cases, the basic structure of the above-mentioned embodiment in which the islands are distributed in the thin quantum well film is obtained, and in other cases, a quantum box structure in which the islands are completely isolated with each other is obtained. This structure difference is caused by the film thickness and the composition, because the energy of strain varies with the film thickness or the composition of the strained quantum well film formed.

EXAMPLE 1

Example 1 of the present invention will be described below with reference to the accompanying drawings.

Figure 4A:
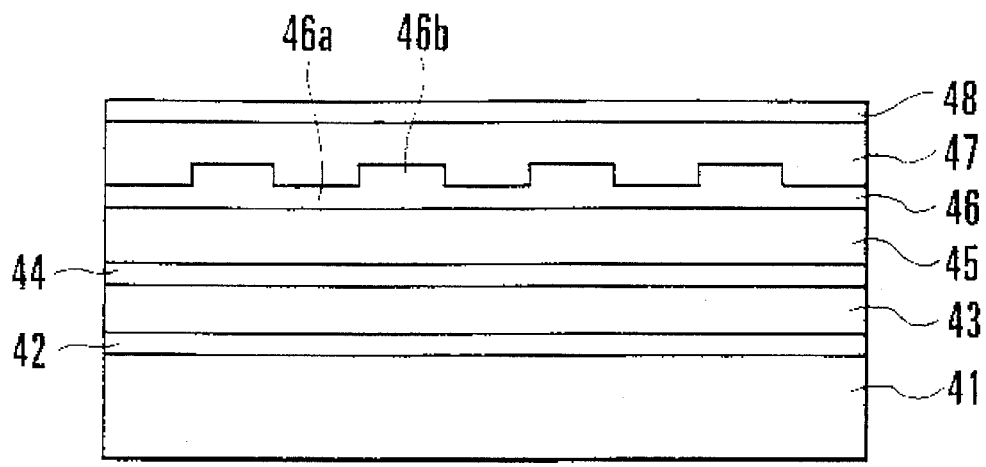
FIGS. 4A and 4B are sectional views each showing the arrangement of a semiconductor quantum structure as one embodiment of the present invention.

FIG. 4A is a sectional view showing the arrangement of optical semiconductor device island regions as Example 1 of the present invention.

This example describes the formation of the optical semiconductor device island regions on a GaAs substrate 41 whose major surface is the (311)B surface, using the successive growth of various layers by changing growth conditions such as a gas flow condition, without unloading the substrate from the processing chamber of a low pressure MOVPE apparatus at a temperature of 750° C.

First, GaAs was grown on the GaAs substrate 41 to form a 10-nm thick GaAs buffer layer 42. Subsequently, $Al_{0.5}Ga_{0.5}As$ was grown to form a 30-nm thick lower barrier layer 43. Thereafter, a 15-nm thick strained quantum well film layer 44 constructed from strained $In_{0.2}Ga_{0.8}As$, a 100-nm thick barrier layer 45 constructed from strained $Al_{0.5}Ga_{0.5}As$, and a strained $In_{0.25}Ga_{0.75}As$ layer 46 were successively formed in this order. At this stage, a growth interruption time of 2.5 min was taken.

The strained $Al_{0.5}Ga_{0.5}As$ that was grown prior to the barrier layer 45 kept the film state as the strained quantum well film layer 44, since the barrier layer 45 was formed subsequently. On the other hand, the strained $In_{0.25}Ga_{0.75}As$ grown on the buffer layer 45 partially changed during this growth interruption formed a carrier confinement layer 46 constituted by a thin strained quantum well film 46a with a relatively small film thickness and fine islands 46b distributed in this thin film and having a relatively large film thickness.

After this growth interruption, $Al_{0.5}Ga_{0.5}As$ was grown on the resultant structure to form a 50-nm thick planarizing semiconductor barrier layer 47, and GaAs was then grown on the layer 47 to form a 10-nm thick cap layer 48, thereby fabricating the semiconductor quantum structure illustrated in the sectional view of FIG. 4A.

The above semiconductor quantum structure according to the present invention was labeled as sample 1-a. For comparison, sample 1-b using a GaAs substrate whose major surface was the (311)A surface and sample 1-c using a GaAs substrate whose major surface was the (100) surface were fabricated following exactly the same procedures as discussed above.

To explain the structure of the carrier confinement layer 46 as the characteristic feature of the present invention, sample 1-d (FIG. 4B) was also fabricated using a GaAs substrate whose major surface was the (311)B surface. In this sample 1-d, the planarizing barrier layer 47 in the sample 1-a was not formed. Additionally, sample 1-e was fabricated using a GaAs substrate whose major surface was the (100) surface as a comparative sample of the sample 1-d. The structures of these samples were compared.

The surface of these samples were observed using a scanning electron microscope. Consequently, no clear structure was observed on the surfaces of the samples 1-a, 1-b, 1-c, and 1-e, indicating that the flat surfaces were obtained in these samples.

Figure 4B:
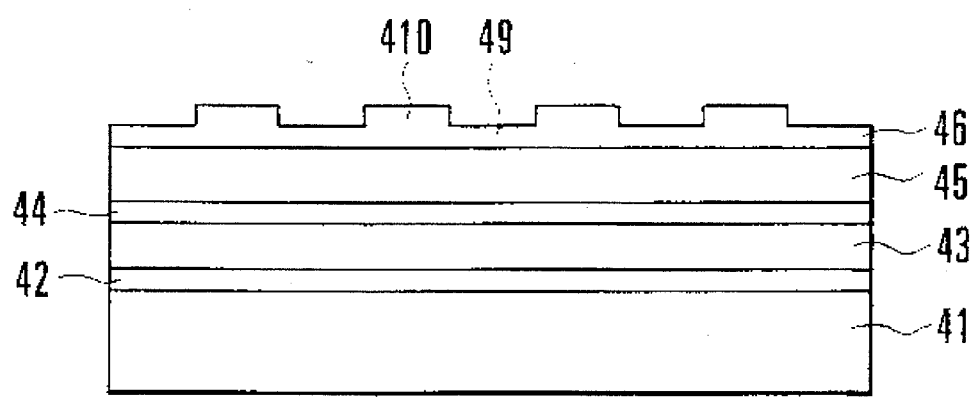

On the other hand, in the sample 1-d corresponding to the sample 1-a, which was formed to explain the characteristic feature of the present invention, the state illustrated in the sectional view of FIG. 4B was obtained as can be seen from the electron micrograph in FIG. 5 which represents fine islands formed on the substrate. In this sample 1-d, a carrier confinement layer 46 consisting of strained $In_{0.25}Ga_{0.75}As$ was constituted by a 3-nm thick thin film 49 and a large number of islands 410 about 70 nm in diameter and about 10 nm in thickness which were distributed in the thin film. This structure with a large number of islands constituting the carrier confinement layer 46 of the sample 1-d can be the same as the carrier confinement layer 46 of the sample 1-a.

As discussed above with reference to FIGS. 4B and 5, the islands 410 were regularly formed on the surface of the carrier confinement layer 46 although no pattern was on the GaAs substrate 41. This indicates that the semiconductor quantum structure of the present invention brings about regular self-organization phenomenon, which is governed by the complex interplay between the condition of the (311)B surface, and the surface energy derived from the strain of the strained quantum well film layer formed on the substrate.

Figure 6:
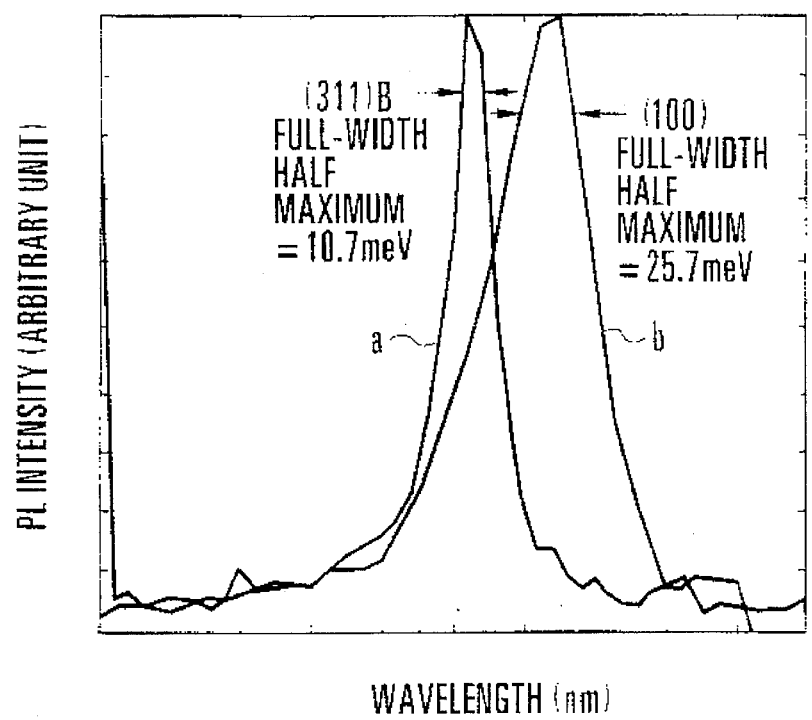
FIG. 6 is a graph showing the emission spectra of samples 1-a and 1-c at room temperature.

FIG. 6 is a graph showing the emission spectra of the samples 1-a and 1-c described above at room temperature. In FIG. 6, curve a indicates the emission spectrum of the sample 1-a, and curve b, that of the sample 1-c. As is apparent from FIG. 6, the full-width half maximum of the curve a is at about 8 nm as a wavelength, i.e., is 10.7 meV, and the full-width half maximum of the curve b is 25.7 meV. That is, the curve a has a smaller full-width half maximum. In FIG. 6, these two curves are expressed to have the same peak in order to compare their full-widths half maximum. Actually, the luminescence intensity of the sample 1-a was twice that of the sample 1-c. In addition, it is evident from FIG. 6 that the peak wavelength of the curve a shifts to shorter wavelengths than the peak wavelength of the curve b. That is, the quantum containment effect of the semiconductor quantum structure of the present invention is observed.

Even GaAs/AlAs-based quantum well films with excellent optical characteristics have a spectral full-width half maximum of about 20 meV at room temperature (Surface Science 174 (1986) 65–70, North-Holland, Amsterdam, PHOTOLUMINESCENCE AND ABSORPTION LINEWIDTH OF EXTREMELY FLAT GaAs-AlAs Quantum well films PREPARED BY MOLECULAR BEAM EPITAXY INCLUDING INTERRUPTED DEPOSITION FOR ATOMIC LAYER SMOOTHING, M. TANAKA el al.) That is, no such a sharp spectrum was observed at room temperature in conventional InGaAs-based structures.

EXAMPLE 2

Example 2 of the present invention will be described below.

In this example, a growth interruption time of 2 minutes was taken after strained $In_{0.25}Ga_{0.75}As$ was formed subsequently to the barrier layer 45 in Example 1 described above. After this growth interruption, an $Al_{0.5}Ga_{0.5}As$ layer was grown to form a 50-nm thick planarizing barrier layer.

In this Example 2, subsequently to the formation of the planarizing barrier layer, the growth of the 5-nm thick strained $In_{0.25}Ga_{0.75}As$, the 2-min growth interruption, and the growth of the 50-nm thick $Al_{0.5}Ga_{0.5}As$ were repeated twice. Thereafter, a GaAs cap layer was formed. The result was a semiconductor quantum structure in which three carrier confinement layers were formed, as illustrated in FIG. 2.

After this 3-layer semiconductor quantum structure was subjected to stain etching, the cross-section of the structure was observed by a scanning electron microscope, consequently, in these layers, it was found that islands about 50 nm in diameter and about 9 nm in thickness were distributed in a thin film about 2.5 nm thick.

Figure 7:
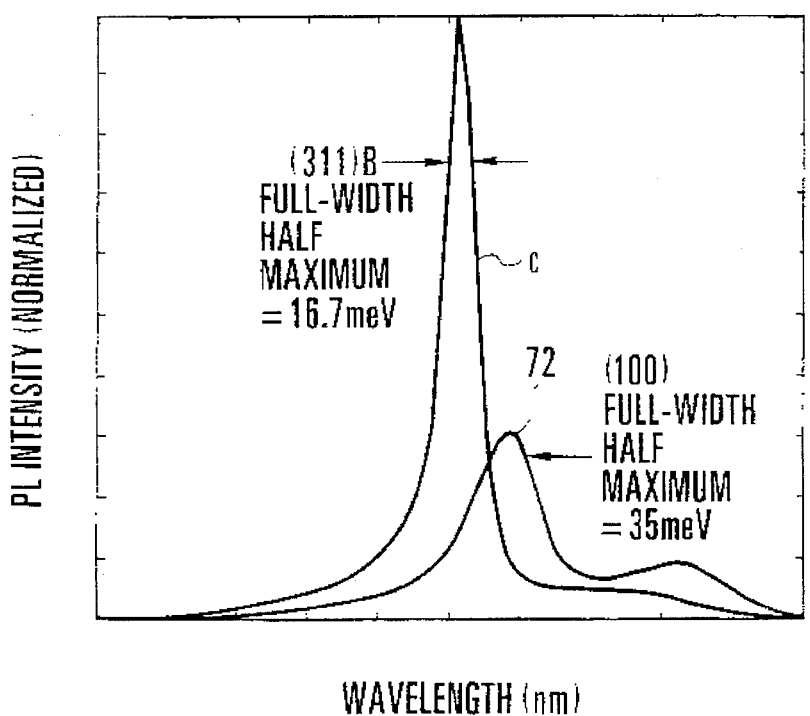
FIG. 7 is a graph showing the emission spectra in a semiconductor quantum structure in which three carrier confinement layers are stacked.

FIG. 7 shows the emission spectrum of this sample. The curve c with a full-width half maximum of 16.7 meV was obtained, and a strong photoluminescence intensity. On the other hand, in the case of a comparative sample fabricated with the same procedures as described above on the GaAs (100) surface, a spectral full-width half maximum of 35 meV, and a relatively weak intensity were observed in curve d.

Table 1 below shows the results of Examples 3 to 19 in which islands of various diameters were formed by changing the substrate, the barrier layer, the quantum well film layer, the growth temperature, and the stacking number.

TABLE 1

| Example | 3 | 4 | 5 | 6 | 7 |
|---|---|---|---|---|---|
| Substrate | (311)B GaAs | (211)B GaAs | (411)B GaAs | (511)B GaAs | (611)B GaAs |
| Barrier layer: film thickness (nm) | $Al_{0.4}Ga_{0.6}As$: 50 nm | $Al_{0.5}Ga_{0.5}As$: 60 nm [$In_{0.2}Ga_{0.8}As$: 10 nm] | $Al_{0.5}Ga_{0.5}As$: 50 nm [$In_{0.2}Ga_{0.8}As$: 10 nm] | $Al_{0.5}Ga_{0.5}As$: 50 nm [$In_{0.2}Ga_{0.8}As$: 10 nm] | $Al_{0.3}Ga_{0.7}As$: 50 nm [$In_{0.2}Ga_{0.8}As$: 10 nm] |
| Carrier confined layer: film thickness (nm) | $In_{0.25}Ga_{0.75}As$: 6.0 nm | $In_{0.25}Ga_{0.75}As$: 5.0 nm | $In_{0.27}Ga_{0.73}As$: 5.0 nm | $In_{0.3}Ga_{0.7}As$: 5.0 nm | $In_{0.3}Ga_{0.7}As$: 5.5 nm |
| Growth temperature (20 C.) | 760 | 750 | 740 | 750 | 770 |
| Stacking number | 1 | 1 | 1 | 1 | 1 |
| Thickness of thin film (nm) | 3.5 | 2.5 | 2.5 | 2.5 | 3.0 |
| Disk dimensions (nm) | thickness: 11 nm diameter: 120 nm | thickness: 10 nm diameter: 60 nm | thickness: 10 nm diameter: 100 nm | thickness: 9 nm diameter: 110 nm | thickness: 10 nm diameter: 120 nm |

| Example | 8 | 9 | 10 | 11 | 12 |
|---|---|---|---|---|---|
| Substrate | (711)B GaAs | (311)B GaAs | (211)B InP | (311)B InP | (411) BInP |
| Barrier layer: film thickness (nm) | $Al_{0.3}Ga_{0.7}As$: 50 nm [$In_{0.2}Ga_{0.8}As$: 10 mm] | $Al_{0.4}Ga_{0.6}As$: 50 nm [$GaAs_{0.8}Sb_{0.2}$: 5 nm] | $In_{0.5}Al_{0.3}Ga_{0.2}As$: 50 nm [$In_{0.2}Ga_{0.8}As$: 10 nm] | $In_{0.5}Al_{0.3}Ga_{0.2}As$: 50 nm [$In_{0.2}Ga_{0.8}As$: 10 nm] | $In_{0.5}Al_{0.3}Ga_{0.2}As$: 50 nm [$In_{0.2}Ga_{0.8}As$: 10 nm] |
| Carrier confined layer: film thickness (nm) | $In_{0.3}Ga_{0.7}As$: 5.5 nm | $GaAs_{0.7}Sb_{0.3}$: 4.5 nm | $In_{0.3}Ga_{0.7}As$: 4.0 nm | $In_{0.3}Ga_{0.7}As$: 4.0 nm | $In_{0.3}Ga_{0.7}As$: 4.5 nm |
| Growth temperature (°C.) | 770 | 800 | 700 | 700 | 700 |
| Stacking number | 1 | 1 | 1 | 1 | 1 |
| Thickness of thin film (nm) | 3.0 | 2.5 | 2.0 | 2.0 | 2.5 |
| Disk dimensions (nm) | thickness: 10 nm diameter: 30 nm | thickness: 9 nm diameter: 90 nm | thickness: 8.5 nm diameter: 60 nm | thickness: 8 nm diameter: 70 nm | thickness: 9 nm diameter: 90 nm |

| Example | 13 | 14 | 15 | 16 | 17 |
|---|---|---|---|---|---|
| Substrate | (511)B InP | (611)B InP | (711)B InP | (311)B InP | (311)B InP |
| Barrier layer: film thickness (nm) | $In_{0.4}Al_{0.4}Ga_{0.2}As$: 50 nm [$In_{0.2}Ga_{0.8}As$: 10 nm] | $In_{0.4}Al_{0.4}Ga_{0.2}As$: 50 nm [$In_{0.2}Ga_{0.8}As$: 10 nm] | $In_{0.4}Al_{0.4}Ga_{0.2}As$: 50 nm [$In_{0.2}Ga_{0.8}As$: 10 nm] | $In_{0.52}Al_{0.48}As$: 50 nm [$In_{0.53}Ga_{0.47}As$: 5 nm] | $In_{0.52}Al_{0.48}As$: 30 nm [$In_{0.53}Ga_{0.47}As$: 5 nm] |
| Carrier confined layer: film thickness (nm) | $In_{0.25}Ga_{0.75}As$: 4.5 nm | $In_{0.25}Ga_{0.75}As$: 4.5 nm | $In_{0.25}Ga_{0.75}As$: 4.5 nm | $In_{0.4}Ga_{0.6}As_{0.8}Sb_{0.2}$: 4.0 nm | $In_{0.4}Ga_{0.6}As_{0.8}Sb_{0.2}$: 3.5 nm |
| Growth temperature (°C.) | 720 | 720 | 720 | 700 | 700 |
| Stacking number | 1 | 1 | 1 | 1 | 1 |
| Thickness of thin film (nm) | 2.5 | 2.0 | 2.0 | 2.0 | 1.5 |
| Disk dimensions (nm) | thickness: 9 nm diameter: 110 nm | thickness: 8 nm diameter: 125 nm | thickness: 8 nm diameter: 70 nm | thickness: 7 nm diameter: 90 nm | thickness: 6 nm diameter: 70 nm |

| Example | 18 | 19 |
|---|---|---|
| Substrate | (311)B InP | (311)B InP |
| Barrier layer: film thickness (nm) | $In_{0.52}Al_{0.48}As$: 100 nm [$In_{0.7}Ga_{0.3}As$: 15 nm] | InP: 50 nm [$In_{0.7}Ga_{0.3}As$: 10 nm] |
| Carrier confined layer: film thickness (nm) | $In_{0.8}Ga_{0.2}As$: 3.5 nm | $In_{0.8}Ga_{0.2}As$: 4.5 nm |
| Growth | 625 | 600 |

TABLE 1-continued

|  | | |
|---|---|---|
| temperature (°C.) | | |
| Stacking number | 1 | 1 |
| Thickness of thin film (nm) | 1.5 | 2.0 |
| Disk dimensions (nm) | thickness: 4 nm diameter: 30 nm | thickness: 6 nm diameter: 40 nm |

Note that data given in [] in the column of "Barrier layer" in Table 1 indicates the strained quantum well film layer formed below the barrier layer below the carrier confinement layer with an island structure.

As is apparent from Examples 1 and 2 described above and Table 1, the semiconductor quantum structure of the present invention can be formed in a variety of systems by the growth of carrier confinement layers consisting of strained quantum well films on the surface of the (n11)B substrate and following growth interruption.

In Example 4, for instance, fine islands about 60 nm in diameter were obtained on a GaAs substrate with the (211)B surface. The luminescence intensity was about three times higher than that of the sample on the (100) GaAs surface. Also, the full-width half maximum of the emission spectrum was as narrow as 12 meV.

In Example 6, it was also possible to obtain an emission spectrum with a narrow full-width half maximum of 14 meV.

In Example 10, fine islands of about 60 nm in diameter were obtained on an InP substrate with the (211)B surface. Also, the full-width half maximum of the emission spectrum was as narrow as 15 meV, and the luminescence intensity was about three times higher than that in the sample of InP (100) substrate.

Likewise, an emission spectrum with a narrow full-width half maximum of 13 meV was obtained on an InP substrate with the (311)B surface in Example 11.

As is evident from the above examples, the growth of a carrier confinement layer composed of a strained quantum well film and barrier layers on the (n11)B-surface substrate and following the growth interruption, allows us to obtain a semiconductor structure in which fine islands with a relatively large film thickness are distributed in the quantum well films formed to serve as the carrier confinement layers.

It is therefore evident that the present invention is not limited to the above examples but is valid to other various combinations.

In Examples 1 to 19 discussed above, carrier confinement layers consisting of thin strained quantum well films were formed, and then growth interruption was performed. In this manner, a large number of fine islands with a relatively large film thickness were distributed in the quantum well films formed to serve as the carrier confinement layers. However, the present invention is not limited to these examples. As an example, it is also possible to completely isolate quantum well films into fine islands by holding the growth interruption for a certain period of time, as in the states of examples to be described later.

The basic arrangement according to the present invention in which a semiconductor carrier confinement layer has an island structure will be described below with reference to the accompanying drawings.

Figure 8:
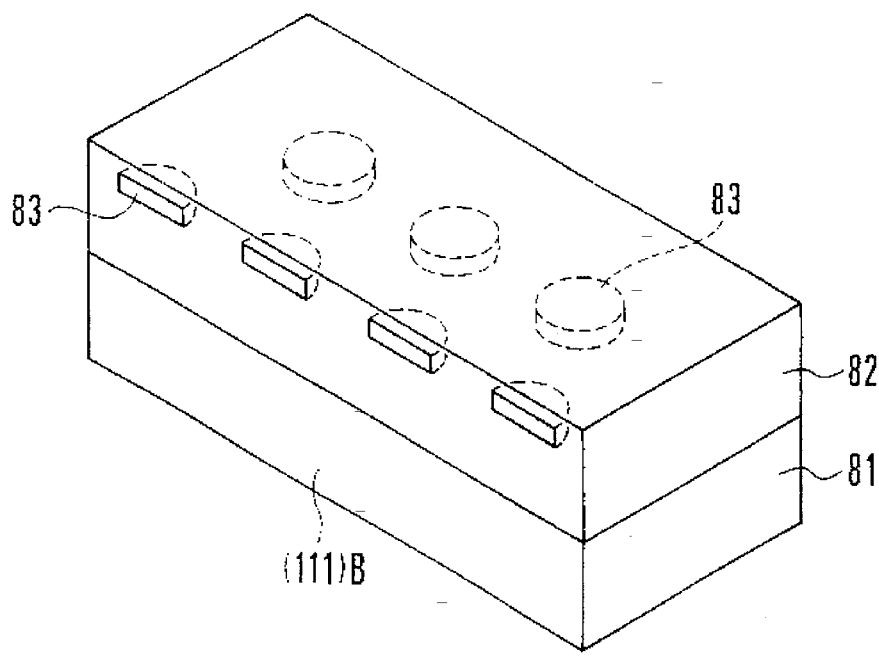
FIG. 8 is a perspective view showing the basic structure of island regions for an optical semiconductor device of the present invention.

FIG. 8 is a schematic view showing the basic structure of island regions for an optical semiconductor device of the present invention.

This structure is constituted by a high-index-number substrate 81, a semiconductor barrier layer 82 formed on the substrate, and a carrier confinement layer 83 in the form of disk-like islands. The substrate 81 has the surface tilted from the low-index-number surface, such as the (100) surface or the (111) surface. The carrier confinement layer 83 is a semiconductor layer surrounded by the semiconductor barrier layer 82 and has strains therein.

The quantum box structure has been theoretically treated to have dimensions almost equal in length, width, and height. However, as in FIG. 8, the present invention provides a flat disk-like shape expanded in the direction of the surface as the islands of the semiconductor carrier confinement layer 83. This is the difference in shape from the conventional quantum box.

As the high-index-number substrate 81 of a compound semiconductor, an (n11)B substrate (n=2, 3, 4, 5, 6, or 7) of GaAs or InP is used. Microscopically, the crystallographic orientations of these substrates consist of the (100) surface on which smooth epitaxial growth readily occurs and the (111)B surface which is the Group-V stabilized surface and on which the growth can hardly take place. For this reason, vapor phase crystal growth on this surface exhibits unique characteristics. Consequently, the island regions for an optical semiconductor device as illustrated in FIG. 8 are obtained.

Figure 9A:
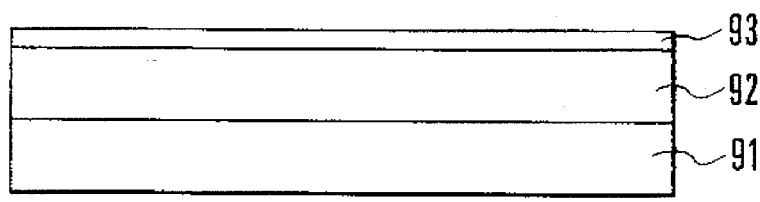
FIGS. 9A to 9C are sectional views showing the steps of a method of forming the optical semiconductor device island regions.
Figure 9B:
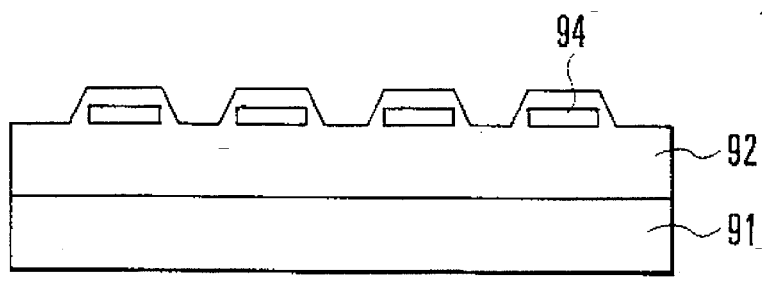
Figure 9C:
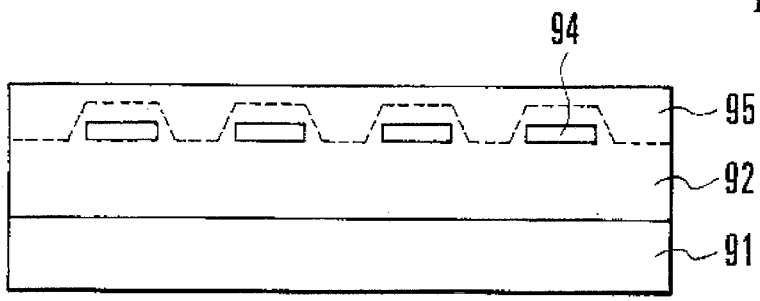

The basic concept of a method of forming the above island regions for an optical semiconductor device will be described below. FIGS. 9A to 9C are sectional views for explaining this optical semiconductor device island region formation method.

First, a semiconductor barrier layer 92 is formed on a high-index-number substrate 91, and a thin strained quantum well film 93 is formed on the layer 92. As illustrated in FIG. 9A, immediately after the growth, the thin strained quantum well film 93 is a quantum well film not separated into islands. However, after an appropriate growth interruption time, the strained quantum well film layer 93 crystallizes into islands, forming a carrier confinement layer 94 in the form of disks. When the growth interruption is further continued, due to the mass transport, the barrier layer 92 covers the islands of the carrier confinement layer 94 including their top portions, as illustrated in FIG. 9B.

Thereafter, as in FIG. 9C, a flat surface is obtained by further growing a semiconductor barrier layer 95.

Although one island-structure carrier confinement layer is formed in the above description, the present invention is not limited to this structure. For example, as illustrated in FIG. 10, a plurality of island-structure carrier confinement layers may be formed.

Figure 10:
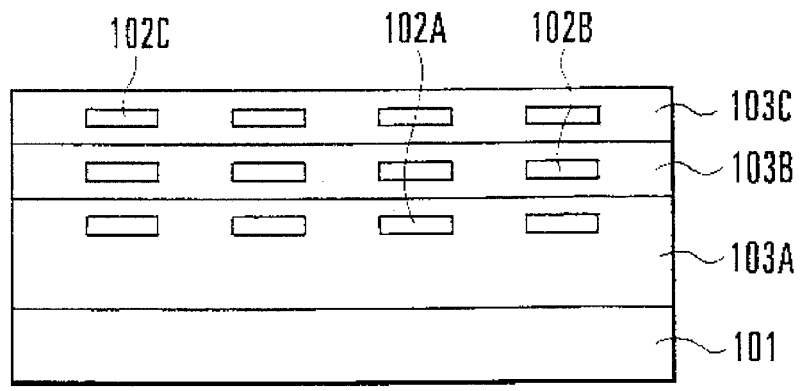
FIG. 10 is a sectional view showing the state in which a plurality of layers of optical semiconductor device island regions are formed.

FIG. 10 is a sectional view showing the state in which island-structure carrier confinement layers, as island regions for an optical semiconductor device, are stacked in the direction perpendicular to the substrate surface. In FIG. 10, reference numeral 101 denotes a high-index-number substrate; 102, carrier confinement layers in the form of disks; and 103, semiconductor barrier layers surrounding the carrier confinement layers 102 including their top portions due to the mass transport.

A high-density optical semiconductor device island regions can be obtained by forming the stacked structure of the carrier confinement layers 102 as described above.

A method of forming optical semiconductor device island regions with this multi-layer structure will be briefly described below.

Figure 11A:
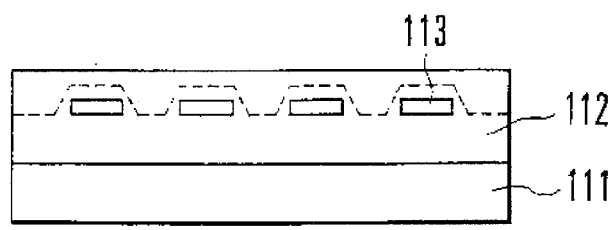
FIGS. 11A to 11D are sectional views for explaining the steps of a method of forming a multi-layer structure of optical semiconductor device island regions.
Figure 11B:
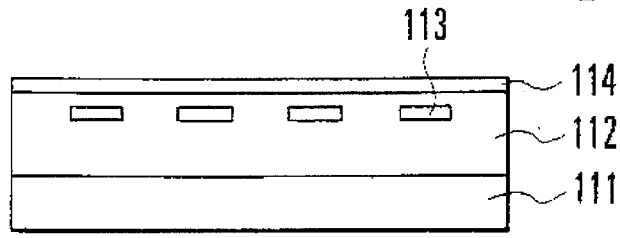
Figure 11C:
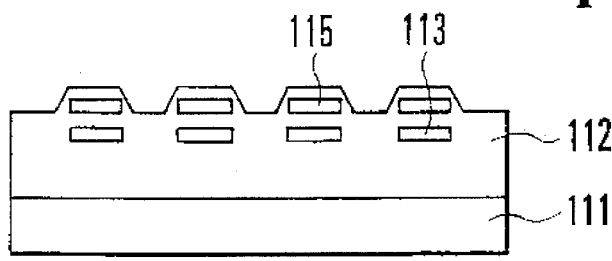
Figure 11D:
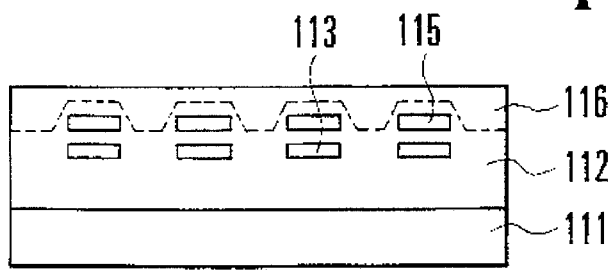

First, as illustrated in FIG. 11A, the first layer constituted by a semiconductor barrier layer 112 and a carrier confinement layer 113 in the form of disk-like islands are formed on a high-index-number substrate 111, and then the planarizing barrier layer 112 is covered. The carrier confinement layer 113 is formed by the same method as for the carrier confinement layers described with reference to FIGS. 9A to 9C so far. All portions of the islands of the carrier confinement layer formed are surrounded by the semiconductor barrier layer 112. Subsequently, as in FIG. 11B, a thin strained quantum well film 114 is formed on top of the structure, and growth interruption is performed. Thereafter, a second island-structure carrier confinement layer 115 is formed as in FIG. 11C, and a barrier layer 116 is grown on the layer 115 as in FIG. 11D. By repeating a series of these processes, optical semiconductor device island regions with a multi-layer structure as shown in FIG. 10 can be formed.

EXAMPLE 20

Figure 12:
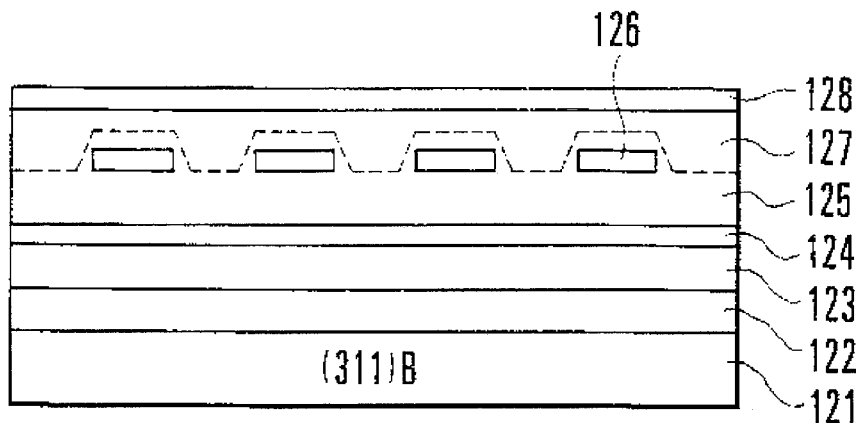
FIG. 12 is a sectional view showing the arrangement of optical semiconductor device island regions in Example 20 of the present invention.

FIG. 12 shows the arrangement of island regions for an optical semiconductor device in Example 20 of the present invention. In FIG. 12, reference numeral 121 denotes a GaAs substrate whose major surface is the (311)B; 122, a GaAs buffer layer formed on the GaAs substrate 121; 123, a lower barrier layer composed of $Al_xGa_{1-x}As$; 124, a strained quantum well film layer composed of $In_yGa_{1-y}As$ which is a lattice mismatch system with respect to $Al_xGa_{1-x}As$; 125, a lower barrier layer formed on the quantum well film layer 124 and composed of $Al_xGa_{1-x}As$; 126, a carrier confinement layer with a disk-like island structure obtained by forming $In_zGa_{1-z}As$ strained quantum well films; 127, an upper barrier layer composed of $Al_xGa_{1-x}As$; and 128, a GaAs cap layer.

A method of forming the optical semiconductor device island regions illustrated in FIG. 12 will be described below.

In this example, the optical semiconductor device island regions are formed on the GaAs substrate 121 whose major surface is the (311)B by successive growth of various materials at a temperature of 750° C.

First, GaAs is grown on the GaAs substrate 121 to form the GaAs buffer layer 122. Subsequently, $Al_xGa_{1-x}As$ is grown to form the lower barrier layer 123. Thereafter, strained quantum well films are formed by sequentially growing the $In_yGa_{1-y}As$ layer 124, the $Al_xGa_{1-x}As$ layer 125, and the $In_zGa_{1-z}As$ layer 126. At this stage, a growth interruption time of 2 minutes is taken. The $In_yGa_{1-y}As$ layer 124 thus grown is in the form of a film as represented by the strained quantum well film layer 124, but with this growth interruption, the $In_zGa_{1-z}As$ strained quantum well film layer 126 aggregates into islands, i.e., crystallizes, resulting in the disk-like carrier confinement layer 126.

The $In_yGa_{1-y}As$ barrier layer grown below the carrier confinement layer 126 entirely covers the islands of the carrier confinement layer 126 including their top portions due to the mass transport, thereby forming the lower barrier layer 125. After the 2-min growth interruption described above, $Al_xGa_{1-x}As$ is grown on top of the resulting structure to form the upper barrier layer 127. GaAs is then grown to form the cap layer 128, thus fabricating a structure having a flat surface and including island regions for an optical semiconductor device.

The size of the islands of the carrier confinement layer 126 and the distance between them can be changed by the In content z and the film thickness. Note that these factors are independent of the Al concentration (0 to 60%) of the lower barrier layer 125.

The larger the difference between the lattice constant of the underlying layer and the lattice constant of the strained quantum well films formed, the larger the strain energy. The size and spacing of the disk-like islands depend on this difference.

The difference in lattice constant is determined by the composition ratio of In to Ga in $In_zGa_{1-z}As$ of the carrier confinement layer 126. Consequently, the size and spacing of the islands of the carrier confinement layer 126 can be changed by the In content z. For example, by increasing the In content z of $In_zGa_{1-z}As$ to 20, 30, and 40%, the diameter of the disk-like islands of the carrier confinement layer 126 can be controlled to about 150 nm, about 100 nm, and about 70 nm, respectively. In this case, it is possible to change the size and spacing of the islands of the carrier confinement layer 126 by the initially grown film thickness of $In_zGa_{1-z}As$. As an example, by changing the film thickness of $In_zGa_{1-z}As$ grown from 10 to 3 nm while the In content z is fixed at 30%, the diameter of the disk-like islands of the carrier confinement layer 126 can be reduced from 100 to 50 nm.

No such a phenomenon of formation of islands takes place in a lattice-matched GaAs quantum well film. This indicates that this phenomenon is governed by the strain energy of the strained InGaAs film.

The role of the strained quantum well film 124 formed below the lower barrier layer 125 is not so essential in the present invention. Therefore, the above-mentioned islands can be formed by taking a waiting time of about 2 minutes after the growth of $In_zGa_{1-z}As$. As has been discussed earlier, however, the disk dimensions of the carrier confinement layer 126 tend to be uniform more easily when the strained quantum well film layer 124 composed of $In_yGa_{1-y}As$ is present.

Note that after the formation of the upper barrier layer 127 for planarization, it is possible to repeat the growth of $In_zGa_{1-z}As$, the 2-min growth interruption, and the growth of the barrier layer for planarization. This makes it possible to form optical semiconductor device island regions in which multiple layers are stacked.

In the above example, the GaAs (311)B substrate is used. However, the formation of island regions for an optical semiconductor device is possible with the surface of another orientation in which the (100) surface and the (111)B surface are present at a different ratio, e.g., the (211)B surface, the (411)B surface, the (511)B surface, the (611)B surface, or the (711)B surface.

Also, in a strained epitaxial film growth system of another material, similar optical semiconductor device island regions can be formed on a compound semiconductor substrate with the high-index-number surface in exactly the same way as discussed above by using the MOVPE method. Examples of the system are a system using strained $GaAs_zSb_{1-z}$ as a semiconductor carrier confinement layer and $Al_yGa_{1-y}As$ as a barrier layer on a GaAs substrate, a system using strained $In_xGa_{1-x}As$ as a semiconductor carrier confinement layer and $In_yGa_{1-y-x}As$ as a barrier layer on an InP substrate, a system using strained $In_xGa_{1-x}As$ as a semiconductor carrier confinement layer and $In_yAl_{1-y}As$ as a barrier layer, a system using strained $In_xGa_{1-x}As$ as a semiconductor carrier confinement layer and InP as a carrier layer, and a system using strained $In_xGa_{1-x}As_zSb_{1-z}$ as a semiconductor confinement layer and $In_yAl_{1-y}As$ as a semiconductor barrier layer on an InP substrate.

The size and density of the islands of the semiconductor carrier confinement layer formed, of course, depending on the type of material of the system.

The basic conditions of the present invention, however, are the use of a substrate with the (n11)B surface, the use of a semiconductor layer containing strains as the semiconductor carrier confinement layer, and the growth interruption which allows the aggregation of the semiconductor layer containing strains into disk-like islands and the mass transport of a barrier layer.

This optical semiconductor device island region exhibits unusual optical characteristics which are different from those of conventionally fabricated quantum well film box structures. That is, a quantum well film box structure formed by conventional selective growth or the like has a luminescence intensity at room temperature weaker than that of a quantum well film. In addition, the line width of an emission spectrum is largely increased due to the influence of size fluctuation during the fabrication. The full-width half maximum of this spectral line is usually 40 meV or more.

However, the optical semiconductor device island region of the present invention has a higher luminescence intensity than a quantum well film formed on a (100) substrate under the same conditions. Also, the width of a spectral line is very small; that is, the full-width half maximum less than 20 meV is obtained in many examples of the present invention.

Even GaAs/AlAs-based quantum well films known to exhibit good luminescence characteristics have a spectral full-width half maximum of about 20 meV (Surface Science 174 (1986) 65–70, North-Holland, Amsterdam, PHOTOLUMINESCENCE AND ABSORPTION LINEWIDTH OF EXTREMELY FLAT GaAs-AlAs Quantum well films PREPARED BY MOLECULAR BEAM EPITAXY INCLUDING INTERRUPTED DEPOSITION FOR ATOMIC LAYER SMOOTHING, M. TANAKA el al.) That is, no such narrow full-width half maximum was observed at room temperature in conventional InGaAs-based quantum well films.

As described above, the full-width half maximum of the spectral line of luminescence is very narrow and the luminescence intensity is high compared to the emission spectra of quantum wire structures or quantum well film box structures obtained by conventional etching methods or conventional selective growth method. It is estimated that these characteristics are derived from the facts that islands in each semiconductor island region are very uniformly and densely formed, and that the quality of the crystal of the island region is extremely good, and that the density of states is decreased in the structure of the island region due to the quantum containment effect.

These excellent optical characteristics indicate that the optical semiconductor device island regions of the present invention can be applied to semiconductor lasers or optical non-linear devices such as optical switches.

The state of the optical semiconductor device island regions of the present invention will be described in detail below.

Sample 1-d (FIG. 13A) according to the present invention was fabricated as follows.

Figure 13A:
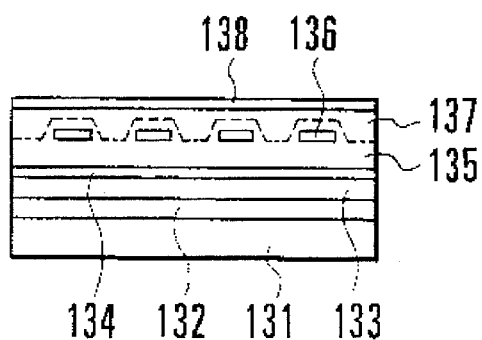
FIGS. 13A to 13D are sectional views for explaining the state of optical semiconductor device island regions of the present invention.

First, a 10-nm thick GaAs buffer layer 132 was grown on a GaAs substrate 131 whose major surface was the (311)B surface at a temperature of 750° C. by using a low-pressure MOVPE method. Subsequently, a 30-nm thick lower barrier layer 133 composed of $Al_{0.5}Ga_{0.5}As$ was grown, and a 5-nm thick strained quantum well film layer 134 composed of $In_{0.2}Ga_{0.8}As$ was grown on it. A 30-nm thick $Al_{0.5}Ga_{0.5}As$ barrier layer 135 was then grown, and a 5-nm thick $In_{0.3}Ga_{0.7}As$ strained quantum well film layer 136 was grown on it. Thereafter, a growth interruption time of 2 minutes was taken. Subsequently, a 30-nm thick $Al_{0.5}Ga_{0.5}As$ planarizing barrier layer 137 was grown, and a 10-nm thick GaAs cap layer 138 was grown on it. An island region for an optical semiconductor device was prepared as the sample 1-a, as shown in FIG. 13A.

For comparison, sample 1-b (not shown) was fabricated following the same procedures as described above by using a GaAs substrate whose major surface was the (311)A surface. Likewise, sample 1-c (not shown) was fabricated by using a GaAs substrate whose major surface was the (100) surface. In addition, samples were fabricated following the same procedures as discussed above except that the layers from the planarizing barrier layer 137 were not formed after the 2-min growth interruption. These samples were fabricated by using a GaAs substrate whose major surface was the (311)B surface (sample 1-d), a GaAs substrate whose major surface was the (311)A surface (sample 1-e), and a GaAs substrate whose major surface was the (100) surface (sample 1-f). The structures of all these samples were compared.

Figure 13B:
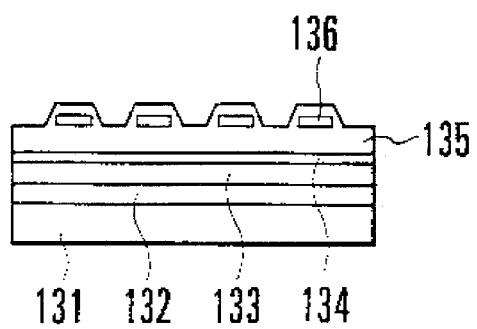

When these samples were observed by using scanning electron micrographs, flat surfaces were observed in the samples 1-a, 1-b, and 1-c. As illustrated in the sectional view of FIG. 13B, in the sample 1-d, a structure in which the layer obtained by growing $In_{0.3}Ga_{0.7}As$ was formed into islands about 100 nm in diameter and these islands were surrounded by the layer formed by growing $Al_{0.5}Ga_{0.5}As$ was obtained.

Figure 13C:
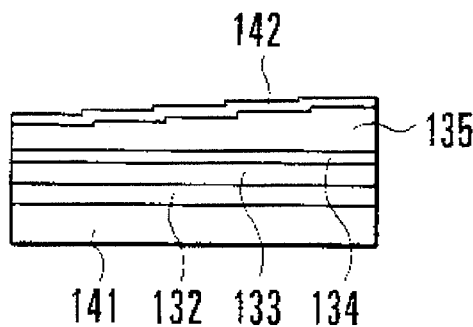
Figure 13D:
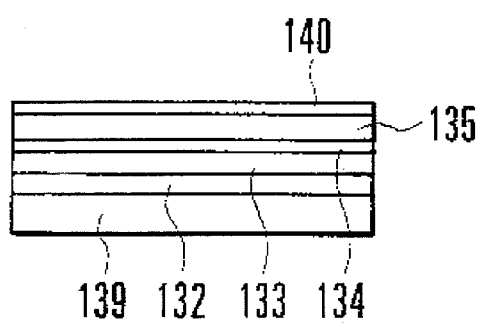
Figure 14A:
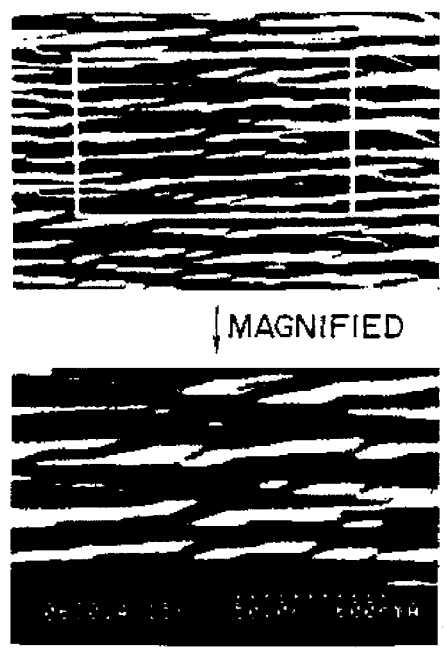
FIGS. 14A and 14B are scanning electron micrographs each showing surface morphology of the substrate in optical semiconductor device island regions of the present invention.

In the sample 1-e, as shown in the sectional view of FIG. 13C and in the electron scanning micrograph of FIG. 14A, a structure having on its surface steps whose periods were not so uniform, i.e., a so-called self-facetting was brought about, and no island structure was obtained. In the sample 1-f, a quantum well film with a completely flat surface was obtained as illustrated in FIG. 13D.

Note that the same reference numerals denote the same parts in FIGS. 13A to 13D. In these drawings, reference numeral 139 denotes a GaAs substrate whose major surface was the (100) surface; 140, a 5-nm thick strained quantum well film layer composed of $In_{0.3}Ga_{0.7}As$; 141, a GaAs substrate whose major surface was the (311)A surface; and 142, a strained quantum well film layer formed by growing $In_{0.3}Ga_{0.7}As$ to have a film thickness of 5 nm.

Figure 14B:
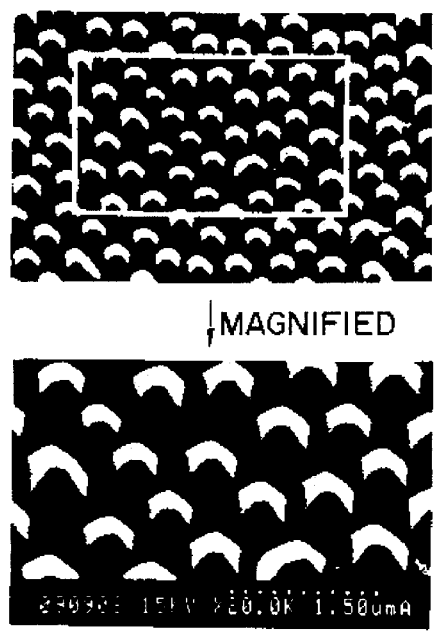

FIG. 14B is a scanning electron micrograph showing the surface state of the sample 1-d, in which a fine pattern formed on the substrate is shown. As in FIG. 14B, the islands of the carrier confinement layer 136 formed by the 2-min growth interruption after the growth of the strained quantum well film layer on the barrier layer 135 were formed regularly, although no patterning was performed on the GaAs substrate 131 (FIG. 13A). This demonstrates that the optical semiconductor device island region of the present invention results from regular self-organization due to the unique surface state of the (311)B surface and the surface energy caused by strains in the strain-containing semiconductor layer (strained well layer).

Figure 15:
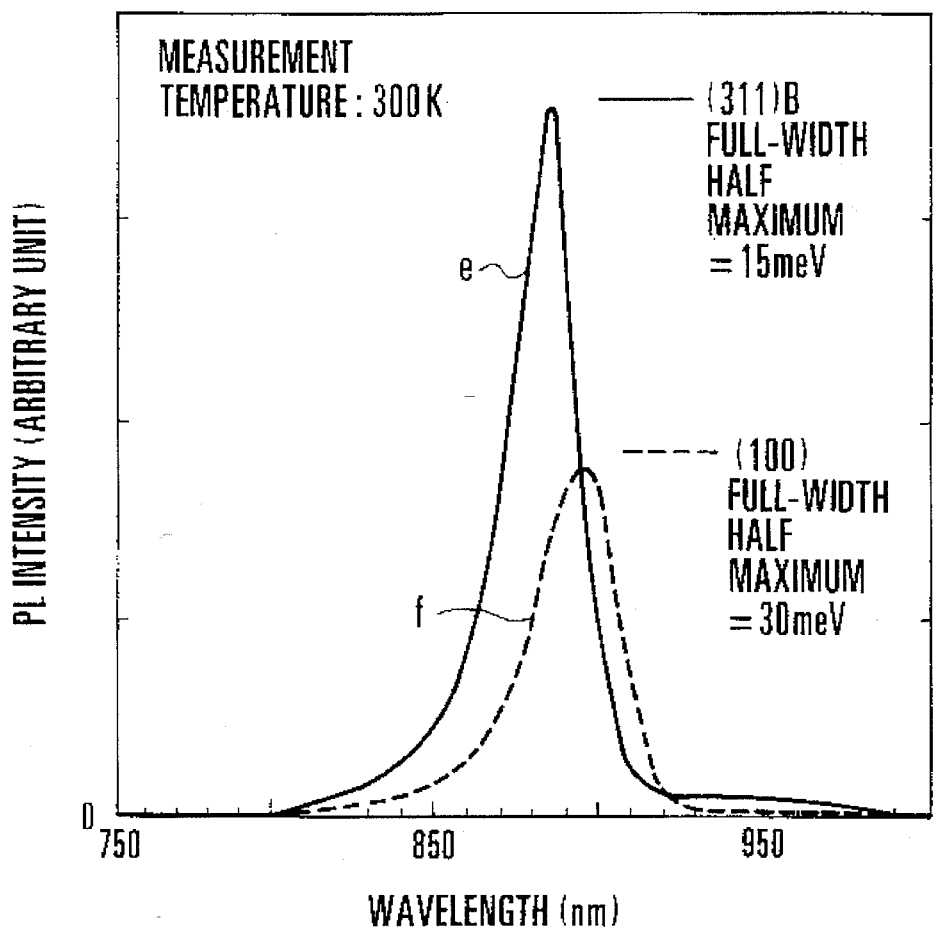
FIG. 15 is a graph showing an emission spectrum of the optical semiconductor device island regions of the present invention and an emission spectrum of a conventional quantum well film structure.

FIG. 15 shows the emission spectra of the samples 1-a and 1-c at room temperature.

In FIG. 15, the curve e indicates the emission spectrum of the sample 1-a, and curve f, that of the sample 1-c. Quantum wire structures or quantum well film box structures that can be conventionally fabricated are inferior to flat quantum well film structures in, e.g., luminescence intensity. However, although the sample 1-a had an island structure similar to the quantum box structure, the emission spectrum e of the sample 1-a had luminescence intensity twice or more that of the emission spectrum f of the sample 1-c which was a quantum well film formed on the substrate whose major surface was the (100) surface.

In addition, the full-width half maximum (FWHM) of the spectral line of the emission spectrum e was 15 meV, which was about half that of the emission spectrum f from a flat quantum well film structure. Furthermore, the emission peak wavelength of the emission spectrum e shifts to shorter wavelengths than the emission spectrum f, indicating the quantum confinement effect.

These excellent optical characteristics indicate that the optical semiconductor device island regions of the present invention are applicable to semiconductor lasers or devices of optical non-linear systems.

COMPARATIVE EXAMPLE 1

In this Comparative Example 1, a structure analogous to that in Example 20 was fabricated by using a GaAs/AlGaAs system as a lattice-matched system.

First, a 10-nm thick GaAs buffer layer was grown on a GaAs substrate whose major surface was the (311)B surface at a temperature of 750° C. by using low-pressure MOVPE. Subsequently, a 30-nm thick lower barrier layer composed of $Al_{0.5}Ga_{0.5}As$ was grown, and then a 5-nm thick lattice-matched GaAs quantum well film layer was grown. Subsequently, a 30-nm thick $Al_{0.5}Ga_{0.5}As$ barrier layer was grown. After a 5-nm thick GaAs quantum well film layer was grown, a growth interruption time of 2 minutes was taken, thereby fabricating a sample.

The resultant sample was observed with a scanning electron microscope. The result was that the surface of the structure was completely flat and no island structure was observed.

EXAMPLE 21

A method of fabricating island regions for an optical semiconductor device of Example 21 of the present invention will be described below.

Figure 16:
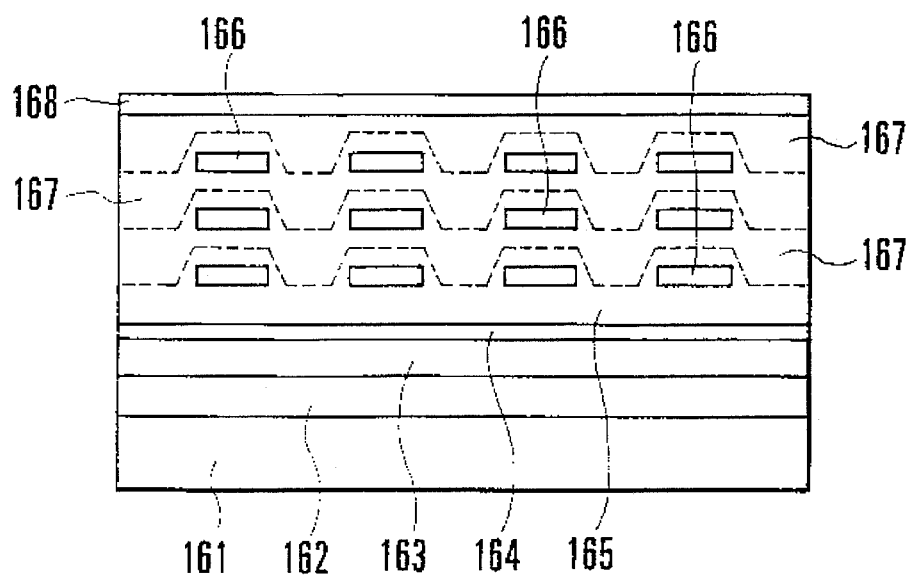
FIG. 16 is a sectional view showing the arrangement of layers of optical semiconductor device island regions in Example 21 of the present invention.

As illustrated in FIG. 16, GaAs was first grown to form a buffer layer 162 on a GaAs substrate 161 whose major surface was the (311)B surface at a temperature of 750° C. by using a low-pressure MOVPE method. Subsequently, a 30-nm thick lower barrier layer 163 composed of $Al_{0.5}Ga_{0.5}As$ was grown. Thereafter, a 5-nm thick $In_{0.2}Ga_{0.8}As$ quantum well film layer 164 and an $Al_{0.5}Ga_{0.5}As$ barrier layer 165 were sequentially grown.

After an $In_{0.3}Ga_{0.7}$ strained quantum well film layer was grown, a growth interruption time of 2 minutes was taken to form islands 166. Subsequently, a 20-nm thick $Al_{0.5}Ga_{0.5}As$ planarizing barrier layer 167 was grown. Thereafter, the growth of the $In_{0.3}Ga_{0.7}$ strained quantum well film layer, the 2-min growth interruption, and the growth of the 20-nm thick $Al_{0.5}Ga_{0.5}As$ planarizing barrier layer 167 were repeated twice. A 10-nm thick GaAs cap layer 168 was then formed.

The section of the optical semiconductor device island region formed as discussed above was observed by using a scanning electron microscope after processing such as stain etching was performed. As a result, it was observed that a 3-layer optical semiconductor device island region consisting of islands 166 about 50 nm in diameter was obtained.

Note that the optical semiconductor device island region of the present invention is not limited to those of the above examples.

Tables 2 and 3 below show the results of other examples in which optical semiconductor device island regions were fabricated with various material systems by changing the substrate, the barrier layer, the quantum well film layer, the growth temperature, and the stacking number.

TABLE 2

| Example | 20 | 21 | 22 | 23 | 24 |
|---|---|---|---|---|---|
| Substrate | (311)B GaAs | (311)B GaAs | (311)B GaAs | (311)B GaAs | (311)B GaAs |
| Barrier layer: film thickness (nm) | $Al_{0.3}Ga_{0.7}As$: 30 nm [$In_{0.2}Ga_{0.8}As$: 5 nm] | $Al_{0.5}Ga_{0.5}As$: 30 nm | $Al_{0.5}Ga_{0.5}As$: 30 nm | $Al_{0.5}Ga_{0.5}As$: 30 nm | $Al_{0.3}Ga_{0.7}As$: 20 nm [$In_{0.2}Ga_{0.8}As$: 5 nm] |
| Carrier confined layer: film thickness (nm) | $In_{0.3}Ga_{0.7}As$: 3 nm | $In_{0.2}Ga_{0.8}As$: 5 nm | $In_{0.3}Ga_{0.7}As$: 5 nm | $In_{0.4}Ga_{0.6}As$: 5 nm | $In_{0.4}Ga_{0.6}As$: 5 nm |
| Growth temperature (°C.) | 800 | 750 | 750 | 750 | 800 |
| Stacking number | 1 | 1 | 1 | 1 | 1 |
| Size (nm) | 65 | 120 | 100 | 70 | 60 |
| Example | 25 | 26 | 27 | 28 | 29 |
| Substrate | (311)B GaAs | (311)B GaAs | (211)B GaAs | (411)B GaAs | (511)B GaAs |
| Barrier layer: film thickness (nm) | $Al_{0.3}Ga_{0.7}As$: 20 nm [$In_{0.2}Ga_{0.8}As$: 5 nm] | $Al_{0.3}Ga_{0.7}As$: 20 nm [$In_{0.2}Ga_{0.8}As$: 5 nm] | $Al_{0.5}Ga_{0.5}As$: 30 nm | $Al_{0.5}Ga_{0.5}As$: 30 nm | $Al_{0.5}Ga_{0.5}As$: 30 nm |
| Carrier confined layer: film thickness (nm) | $In_{0.4}Ga_{0.6}As$: 3 nm | $In_{0.3}Ga_{0.7}As$: 3 nm | $In_{0.3}Ga_{0.7}As$: 5 nm | $In_{0.3}Ga_{0.7}As$: 5 nm | $In_{0.3}Ga_{0.7}As$: 5 nm |
| Growth temperature (°C.) | 800 | 800 | 750 | 750 | 740 |
| Stacking number | 1 | 1 | 1 | 1 | 1 |
| Size (nm) | 25 | 60–70 | 85 | 110 | 90 |

TABLE 2-continued

| Example | 30 | 31 | 32 |
|---|---|---|---|
| Substrate | (611)B GaAs | (711)B GaAs | (311)B GaAs |
| Barrier layer: film thickness (nm) | $Al_{0.5}Ga_{0.5}As$: 30 nm | $Al_{0.5}Ga_{0.5}As$: 30 nm | $Al_{0.5}Ga_{0.5}As$: 30 nm |
| Carrier confined layer: film thickness (nm) | $In_{0.3}Ga_{0.7}As$: 5 nm | $In_{0.3}Ga_{0.7}As$: 5 nm | $GaAs_{0.7}Sb_{0.3}$: 5 nm |
| Growth temperature (°C.) | 750 | 750 | 750 |
| Stacking number | 1 | 1 | 1 |
| Size (nm) | 130 | 150 | 75 |

TABLE 3

| Example | 35 | 36 | 37 | 38 | 39 |
|---|---|---|---|---|---|
| Substrate | (511)B GaAs | (211)B GaAs | (311)B GaAs | (411)B GaAs | (511)B GaAs |
| Barrier layer: film thickness (nm) | $Al_{0.5}Ga_{0.5}As$: 20 nm [GaAs: 5 nm] | $In_{0.5}Al_{0.3}Ga_{0.2}As$: 30 nm | $In_{0.5}Al_{0.3}Ga_{0.2}As$: 30 nm | $In_{0.5}Al_{0.3}Ga_{0.2}As$: 30 nm | $In_{0.4}Al_{0.4}Ga_{0.2}As$: 30 nm |
| Carrier confined layer: film thickness (nm) | $GaAs_{0.8}Sb_{0.2}$: 3 nm | $In_{0.3}Ga_{0.7}As$: 5 nm | $In_{0.3}Ga_{0.7}As$: 5 nm | $In_{0.3}Ga_{0.7}As$: 5 nm | $In_{0.2}Ga_{0.8}As$: 3 nm |
| Growth temperature (°C.) | 800 | 700 | 700 | 700 | 750 |
| Stacking number | 1 | 1 | 1 | 1 | 1 |
| Size (nm) | 60 | 110 | 90 | 150 | 60 |
| Example | 40 | 41 | 42 | 43 | 44 |
| Substrate | (611)B GaAs | (711)B GaAs | (311)B GaAs | (511)B GaAs | (311)B InP |
| Barrier layer: film thickness (nm) | $In_{0.4}Al_{0.4}Ga_{0.2}As$: 30 nm | $In_{0.4}Al_{0.4}Ga_{0.2}As$: 30 nm | $In_{0.52}Al_{0.48}As$: 30 nm $In_{0.53}Ga_{0.47}As$: 5 nm | $In_{0.52}Al_{0.48}As$: 30 nm | $In_{0.52}Al_{0.48}As$: 100 nm [$In_{0.73}Ga_{0.27}As$: 15 nm] |
| Carrier confined layer: film thickness (nm) | $In_{0.2}Ga_{0.8}As$: 3 nm | $In_{0.2}Ga_{0.8}As$: 3 nm | $In_{0.4}Ga_{0.6}As_{0.8}Sb_{0.2}$: 3 nm | $In_{0.5}Ga_{0.5}As_{0.8}Sb_{0.2}$: 3 nm | $In_{0.73}Ga_{0.27}As$: 5 nm |
| Growth temperature (°C.) | 700 | 700 | 700 | 700 | 700 |
| Stacking number | 1 | 1 | 1 | 1 | 1 |
| Size (nm) | 120 | 150 | 95 | 120 | 40 |
| Example | | | 45 | 46 | 47 |
| Substrate | | | (311)B InP | (311)B InP | (311)B InP |
| Barrier layer: film thickness (nm) | | | $In_{0.52}Al_{0.48}As$: 100 nm [$In_{0.25}Ga_{0.75}As$: 15 nm] $In_{0.25}Ga_{0.75}As$: 3.5 nm | InP: 50 nm [$In_{0.7}Ga_{0.3}As$: 7 nm] $In_{0.25}Ga_{0.75}As$: 3.5 nm | InP: 50 nm [$In_{0.7}Ga_{0.3}As$: 7 nm] $In_{0.8}Ga_{0.2}As$: 4 nm |
| Carrier confined layer: film thickness (nm) | | | | | |
| Growth temperature (°C.) | | | 650 | 650 | 670 |
| Stacking number | | | 1 | 1 | 1 |
| Size (nm) | | | 30 | 25 | 20 |

As can be seen from Examples 20 and 21 discussed above and Tables 2 and 3, island regions for optical semiconductor devices can be formed with various systems by growing a carrier confinement layer constituted by a barrier layer and a strained quantum well film layer on the (n11)B substrate surface, and performing growth interruption.

In Example 22, for instance, fine islands about 65 nm in diameter were formed, the luminescence intensity was twice or more that of a quantum well film structure fabricated by using a (100) GaAs substrate, and the full-width half maximum of the emission spectral line was as narrow as 18 meV. In Example 26, fine islands about 60 nm in diameter were formed, the luminescence intensity was about twice or more that of a quantum well film structure fabricated by using a (100) GaAs substrate, and the full-width half maximum of the emission spectral line was as narrow as 19 meV. In Example 27, significantly small islands with a diameter of 25 nm were formed, and the full-width half maximum of the emission spectral line was also as narrow as 20 meV. However, the luminescence intensity was slightly lower than that of a quantum well film structure fabricated by using a (100) GaAs substrate.

In Example 35, on the other hand, an emission spectral line with a narrow full-width half maximum of 20 meV was obtained. Likewise, in Example 42, an emission spectral line with a narrow full-width half maximum of 21 meV was obtained. In addition, the luminescence intensity was three times or more that of a quantum well film structure fabricated by using a (100) GaAs substrate.

Emission spectra having a narrow full-width half maximum at room temperature as in the above examples are usually observed only in very good thin quantum well films. This demonstrates that the optical semiconductor device island region of the present invention has unusual optical characteristics. From the foregoing, it is evident that the present invention is not limited to the examples described above but similarly effective to various other combinations.

Incidentally, when island structures consisting of a plurality of islands as discussed above were analyzed with a transmission electron microscope and energy dispersion elemental analysis, it was found that In was contained in the top portion of the AlGaAs barrier layer covering the strained InGaAs island by mass transport during growth interruption. Especially in the fine-crystal surface layer of AlGaAs in the form of islands, an InAlGaAs structure containing a considerable amount of In was found.

This is because In brings about segregation in a series of processes of a self-organization phenomenon in which the strained InGaAs forms islands. For this reason, the volume occupied by the InGaAs carrier confined portion in the quantum structure having this island structure is significantly reduced compared to that in the state of a quantum well film before the self-organization. The volume of the island-like carrier confined portion can be estimated from the surface density and the sectional shape, but it depends on the formation conditions. The total volume of InGaAs is therefore considered to be reduced to approximately 30 to 50%.

The film thickness of the islands does not increase largely from the film thickness of the quantum well film immediately after growth. Note that this is based on the result of evaluation of the sectional shape using stain etching. For this reason, In mixes in a portion of AlGaAs around the islands. Consequently, there is the possibility that the size of the islands obtained by stain etching using selective etching of InGaAs and AlGaAs is slightly larger than that of an actual carrier confined portion.

Figure 17A:
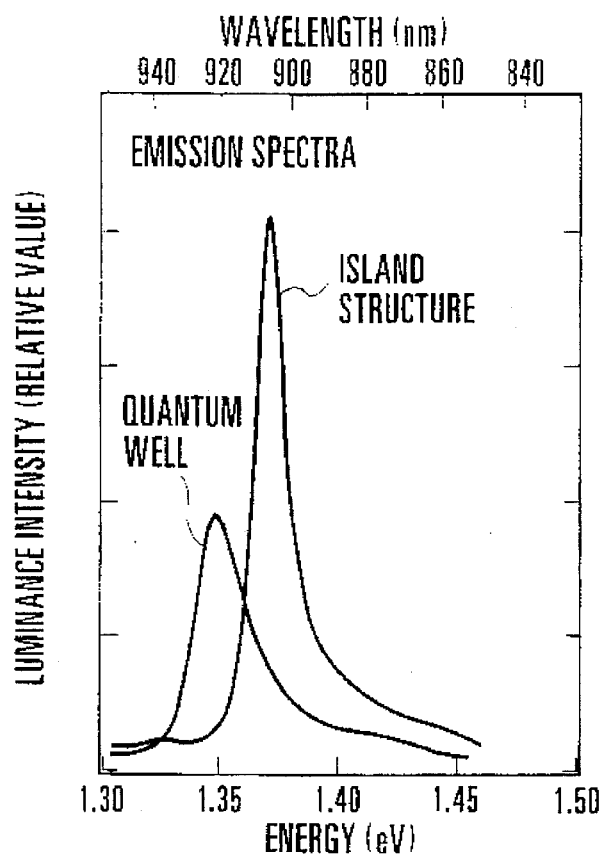
FIGS. 17A and 17B are graphs showing the emission spectrum and the excitation spectrum of luminescence in Example 22 shown in Table 2 in comparison with those of quantum well films formed on a GaAs substrate grown simultaneously with Example 22 under the same growth conditions as in Example 22 and having the (100) surface as the major surface.
Figure 17B:
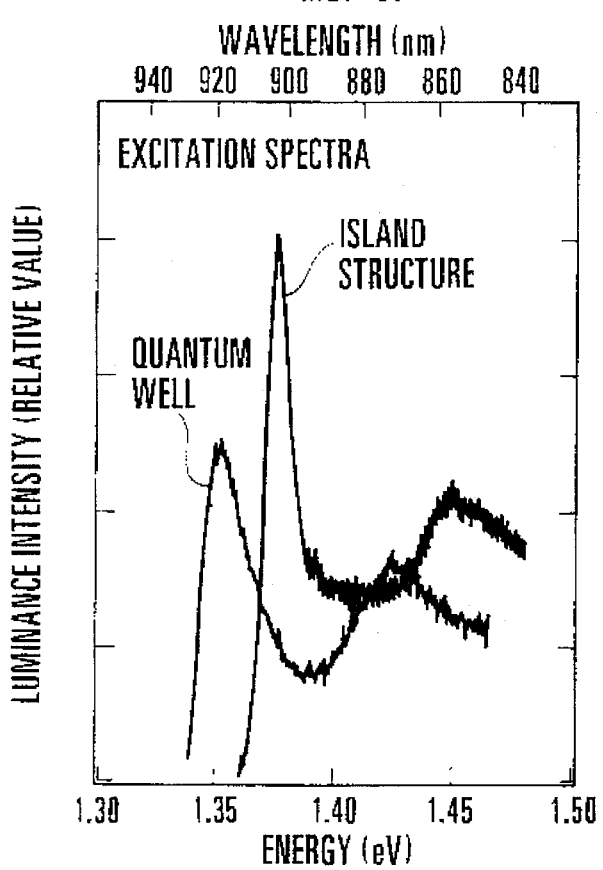

FIGS. 17A and 17B are graphs showing the emission spectrum and the excitation spectrum of luminescence in Example 22 shown in Table 2 in comparison with those of a quantum well film formed on a GaAs substrate grown simultaneously with Example 22 under the same growth conditions as in Example 22 and having the (100) surface as the major surface.

The very sharp emission spectrum of the island structure is due to the sharp exciton absorption. The luminescence intensity was twice or more that of the quantum well film formed on the (100) GaAs substrate, and the full-width half maximum of the emission spectrum was as narrow as 18 meV. This narrow emission spectrum reflects the effect of excitons confined in fine regions of islands.

By taking into account the fact that the volume of the carrier confined portion formed into an island structure is largely reduced from the volume in the form of a quantum well film before formation of the islands, the increase in the luminescence intensity indicates a large increase in the transition probability of the light-emitting portion in this island structure. These results suggest that the oscillator strength in the island portion increases and/or almost no non-radiative process exists due to an excellent crystallinity of the island portion.

As shown in FIG. 17B, the optical semiconductor device having the island-structure carrier confinement layer according to the present invention shows a sharp excitation spectrum of luminescence. Since an excitation spectrum corresponds to an absorption spectrum, this indicates that the exciton absorption of the islands is very sharp and highly intense. From this fact and the prediction that the oscillator strength of the islands increases, this structure has useful characteristic features to be applied to an optical modulator.

EXAMPLE 48

An example in which the present invention discussed above was applied to an optical modulator will be described below.

Figure 18A:
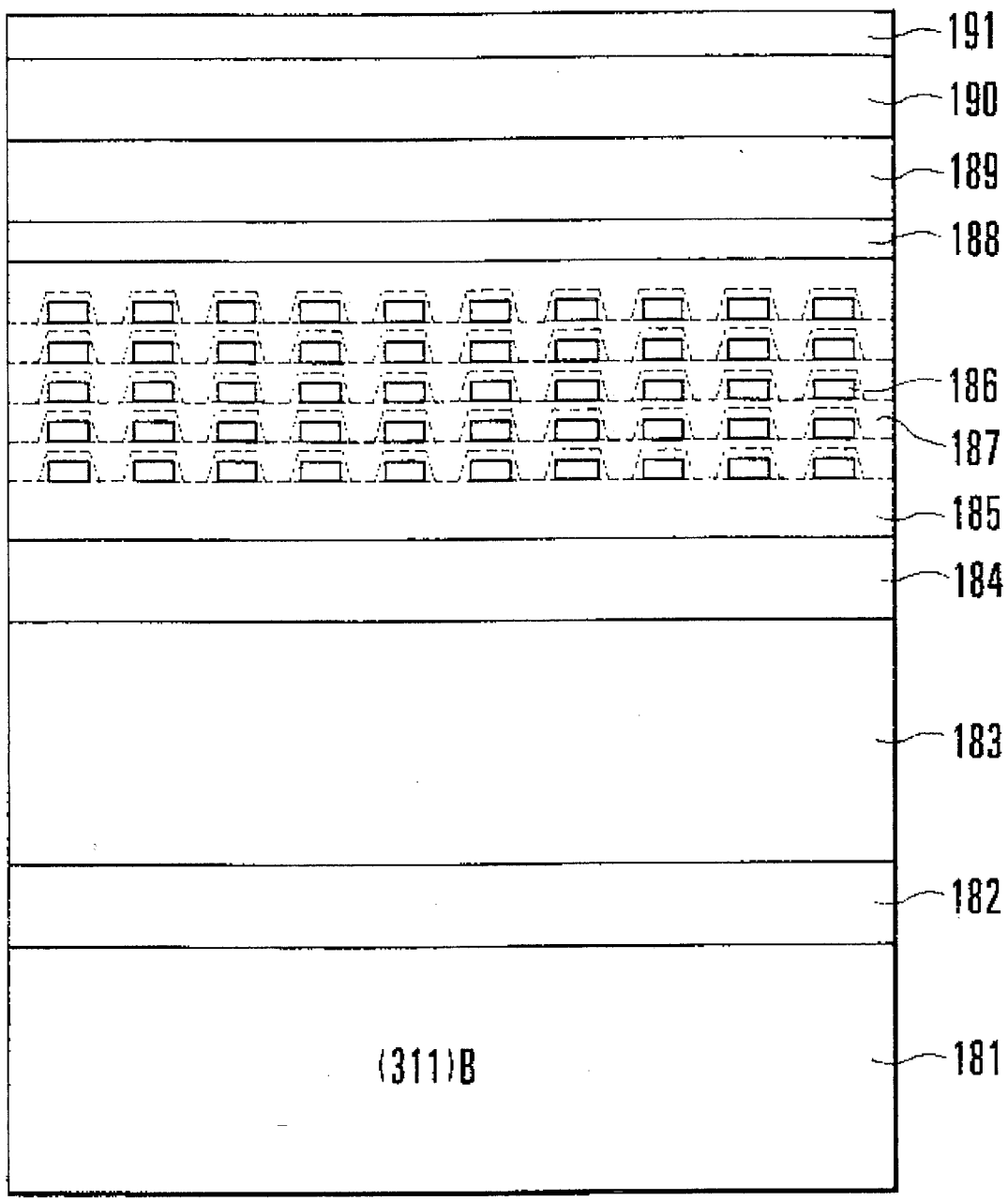
FIGS. 18A and 18B are sectional views showing the arrangement of an optical modulator in Example 48 of the present invention.
Figure 18B:
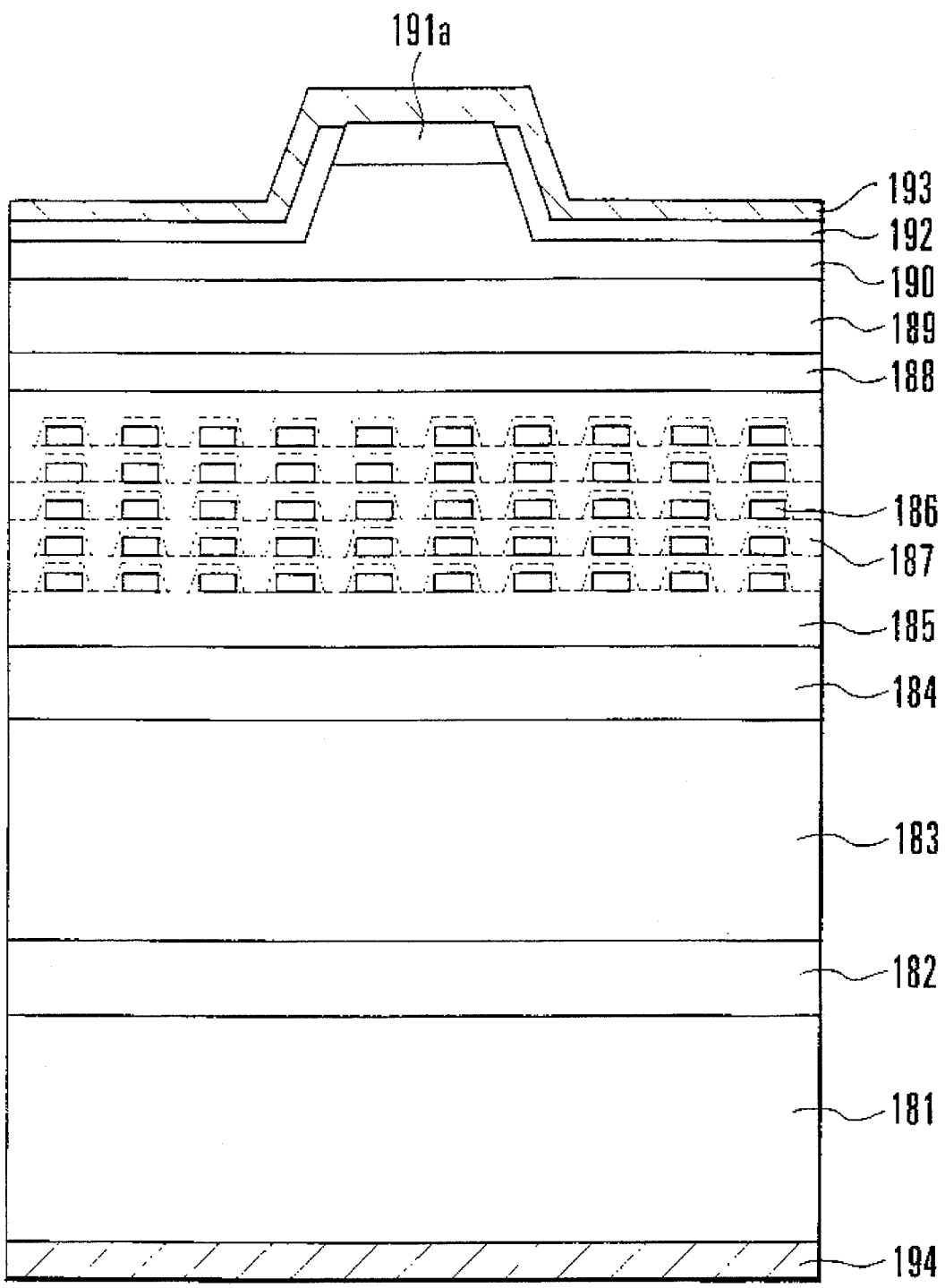

FIGS. 18A and 18B are sectional views showing the steps in fabricating an optical modulator according to Example 48 of the present invention.

First, an n-type GaAs buffer layer 182, a lower cladding layer 183 composed of n-type $Al_{0.2}Ga_{0.75}As$, and a lower waveguiding layer 184 composed of n-type $Al_{0.2}Ga_{0.8}As$ are successively grown on an n-type GaAs substrate 181 whose major surface is the (311)B surface by using MOVPE.

Subsequently, an $Al_{0.15}Ga_{0.85}As$ optical waveguiding layer 185 as a semiconductor carrier blocking layer is grown. Thereafter, a 5-nm thick strained $In_{0.25}Ga_{0.75}As$ quantum well film is grown. Thereafter, a growth interruption time of 2.5 min is taken. The result is an island structure 186 in which the strained $In_{0.25}Ga_{0.75}As$ quantum well film aggregates into a plurality of aggregated islands and the islands are covered with an $Al_{0.15}Ga_{0.85}As$ layer 185 due to mass transport. Then $Al_{0.15}Ga_{0.85}As$ barrier layer 187 is grown to form an almost planarized surface.

The formation of the strained $In_{0.25}Ga_{0.75}As$ quantum well film, the growth interruption for a predetermined time, the formation of the island structure with a plurality of islands, the formation of the barrier layer surrounding the islands, and the planarization by the growth of $Al_{0.15}Ga_{0.85}As$ are repeated four times, thereby forming a structure in which the five island structures 186 and the five barrier layers 187 are alternately stacked.

On the resultant structure, an $Al_{0.5}Ga_{0.85}As$ optical waveguiding layer 188 serving an upper semiconductor carrier blocking layer is grown. Subsequently, a waveguiding layer 189 and an upper cladding layer 190 composed of p-type $Al_{0.25}Ga_{0.75}As$ are grown. Finally, a p$^+$-type GaAs contact layer 191 is grown.

The contact layer 191 and the cladding layer 190 are then processed to form a ridge 191a about 50 μm wide, as illustrated in FIG. 18B. More specifically, a resist pattern is formed by photolithography on the contact layer 191 in the state shown in FIG. 18A, and the ridge 191a is formed by etching the contact layer 191 and the cladding layer 190 by using the resist pattern as a mask. After the ridge 191a is formed, the resist pattern is removed, and a passivation film 192 made from silicon oxide or the like is formed on the entire surface by, e.g., sputtering. A portion of the passivation film 192 on top of the ridge 191a corresponding to an electrode is then removed (etched off), and a p-type electrode 193 composed of Cr/Au or Ti/Pt/Au is formed.

Thereafter, the thickness of the substrate 181 is decreased, and an n-type electrode 194 composed of, e.g., AuGeNi is formed on the lower surface of the substrate. The resultant structure is then ohmic-sintered and cleaved to have a length of 300 μm, thereby completing a modulator structure, as shown in FIG. 18B.

Au wires or the like were bonded to the p-type electrode 193 and the n-type electrode 194 of the device fabricated as discussed above, and a voltage was applied. Spectral light was incident from one end facet by using an optical fiber, and the output light from the other end facet was received with another optical fiber. The absorption spectrum of the light was measured by a photocounting method.

Figure 19:
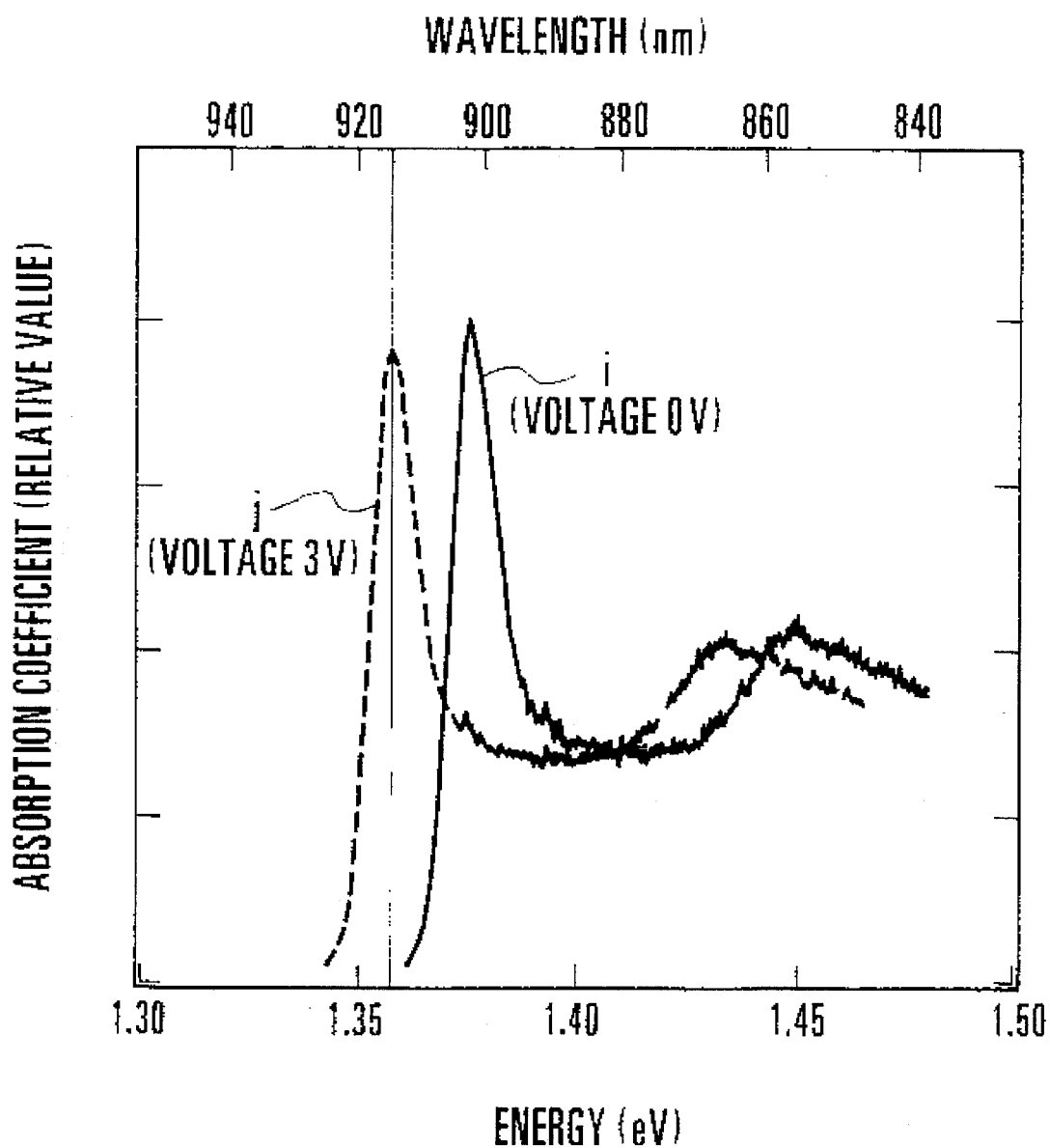
FIG. 19 is a graph showing the absorption spectrum when a reverse vias is applied between the two electrodes of the optical modulator in FIG. 18B and the absorption spectrum when no reverse bias is applied.

FIG. 19 is a graph showing the absorption spectra when a reverse bias was applied between the two electrodes (curve i) and no reverse bias was applied (curve i). It is evident from FIG. 19 that the sharp exciton absorption was observed and a large absorption shift of 20 meV was attained by the application of a reverse bias of 3 V as indicated by the curve j. In addition, the extinction ratio of light having a wavelength of 915 nm was measured by applying an AC voltage of 3 V with the result that a large value of 30 dB was obtained. This result is considered to reflect the characteristic features of the semiconductor carrier confinement layer with an island structure having a sharp exciton absorption and a large absorption shift caused by an electric field.

In this example, only island regions are formed as the semiconductor carrier confinement layer. It is, however, naturally possible to form a structure in which individual island regions are connected by a thin quantum well film, as illustrated in FIG. 1.

EXAMPLE 49

In this example, the present invention was applied to an optical semiconductor laser.

Figure 20:
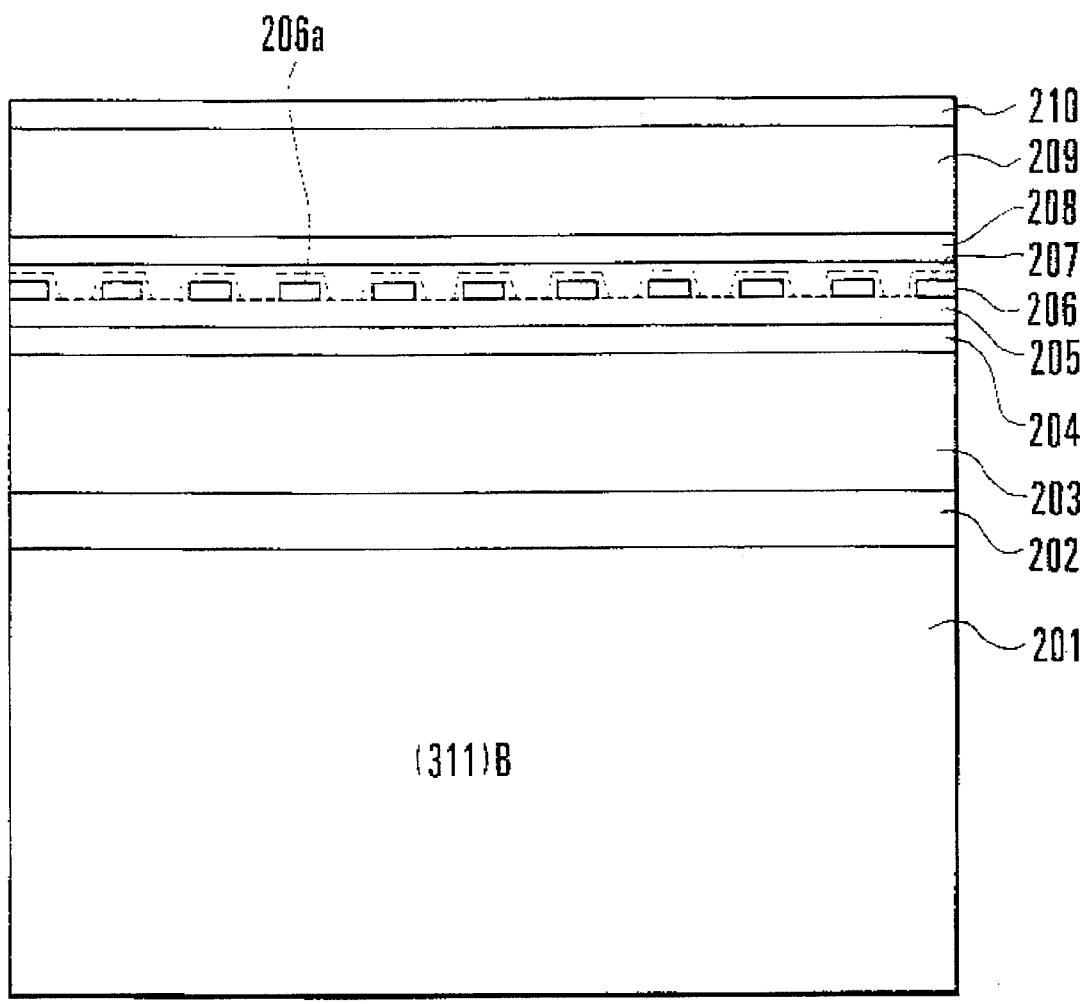
FIG. 20 is a sectional view showing the arrangement of a laser epitaxial film used in one embodiment of a semiconductor laser in Example 49 of the present invention.

FIG. 20 is a sectional view showing the structure of a laser epitaxial film constituting this optical semiconductor laser.

An n-type GaAs (311)B substrate is used as a crystal substrate. Microscopically, this orientation is constituted by 1:1 of the (100) surface on which two dangling bonds are present and smooth epitaxial growth readily occurs and the (111)B surface which is the As stabilized surface and on which growth can hardly occur. On this substrate 201, an n-type GaAs buffer layer 202, a lower cladding layer 203 composed of n-type $Al_xGa_{1-x}As$, and a lower waveguiding layer 204 composed of n-type $Al_xGa_{1-x}As$ (wherein x represents the composition) are successively grown by using MOVPE (Metal Organic Vapor Phase Epitaxy).

Subsequently, a lower $Al_sGa_{1-s}As$ semiconductor carrier blocking layer and an optical waveguiding layer 205 are grown. Thereafter, a thin strained $In_yGa_{1-y}As$ quantum well film 206 as a lattice mismatch system with respect to GaAs is grown to have a thickness within the range of the critical film thickness.

Thereafter, a growth interruption time of 10 sec to 5 min is taken. The result is an island structure 206a in which the thin strained $In_yGa_{1-x}As$ quantum well film 206 aggregates into a plurality of aggregated islands and the islands are covered with the $Al_bGa_{1-b}As$ barrier layer due to mass transport. Note that symbols s, y, and b represent the compositions.

It is also possible, if necessary, to form an n pairs of the barrier layer and thin strained quantum film structure were repeatedly grown with the growth interruption between the growth of each pair to form multi-layer island regions. Thereafter, an upper $Al_sGa_{1-s}As$ semiconductor carrier blocking layer and an optical waveguiding layer 207 are grown. Subsequently, an upper p-$Al_zGa_{1-z}As$ waveguiding layer 208 and an upper p-$Al_yGa_{1-y}As$ cladding layer 209 are grown. Finally, a $p^+$-GaAs contact layer 210 is grown.

In the above laser structure, after the growth of $In_yGa_{1-y}As$ the substrate temperature is held at about 750° C. or higher and the appropriate growth interruption time discussed above is kept. Consequently, the thin two-dimensional InGaAs film once grown is reconstructed and stabilized in the form of a single-crystal $In_yGa_{1-x}As$ island structure, i.e., a disk structure which is more stable in energy. Subsequently, the underlying AlGaAs film is facet-regrown by mass transport, thereby covering the $In_yGa_{1-y}As$ islands. At this point, the size and spacing of the islands can be changed by properly selecting the In content Z and the supply quantity. Especially by increasing the In composition from 20% to 50%, the size is decreased from 150 nm to about 30 nm. Since this growth of islands does not take place in a thin quantum film of lattice-matched GaAs, it is understood that this phenomenon is dominated by the strain energy of the strained InGaAs film. At temperatures of 750° C. or higher, the microscopic surface roughness or the like of the (311)B surface of the substrate held at a high temperature functions as a nucleus to encourage the growth of islands while forming a facet surface stabilized in energy from the epitaxial film. When atoms can be moved due to high temperatures, the mass transport of AlGaAs to the InGaAs surface occurs so that the strain energy is reduced. It is considered that this mass transport occurs in order to settle in the state stabilized in energy with the cover of AlGaAs.

Subsequently, in growing the semiconductor carrier blocking layer and the optical waveguiding layer 207 on this semiconductor disk structure, the corrugation on the surface which is caused by the disk shape are planarized by semiconductor carrier blocking layer and the optical waveguiding layer constructed from material systems with a high surface energy. The surface flatness in this growth changes with the composition of a multi-element compound semiconductor. As the composition of a semiconductor material which can planarize the corrugation on the surface of a disk structure by the growth of an optical waveguiding layer about 50 to 200 nm thick, the Al composition s meets the relation s<0.4 in the $Al_sGa_{1-s}As$ semiconductor carrier blocking layer and the optical waveguiding layer.

FIG. 21A is a schematic view showing the sectional shape when the Al composition s in the 100-nm thick upper $Al_sGa_{1-s}As$ semiconductor carrier blocking layer and the optical waveguiding layer 207 is 0.5. FIG. 21B is a schematic view showing the sectional shape when the Al composition s in the 100-nm thick upper $Al_sGa_{1-s}As$ semiconductor carrier blocking layer and the optical waveguiding layer 207 is 0.3. In the structure in FIG. 21A, the corrugation on the surface was not completely planarized even after the formation of the 100-nm thick upper $Al_sGa_{1-s}As$ semiconductor carrier blocking layer and the optical waveguiding layer. Therefore, the remained corrugation in the interface with the optical waveguiding layer formed on the surface to cause the loss when the waveguide was formed.

On the other hand, in the structure in FIG. 21B, the corrugation on the surface was completely planarized after the formation of the 100-nm thick upper $Al_sGa_{1-s}As$ semiconductor carrier blocking layer and the optical waveguiding layer. The interface with the optical waveguiding layer formed on the surface also was flat.

In the above structure, the Al composition of the waveguiding layers 204 and 208 are set at 0.2 to 0.6 and the Al compositions of the semiconductor carrier blocking layer and the optical waveguiding layer as the optical waveguiding layers 205 and 207 are set at 0.1 to 0.4 as the typical values of a laser epitaxial film, Se or Si as an n-type dopant is doped in the lower waveguiding layer 204 at about $5 \times 10^{17}$ $cm^{-3}$, and Zn, Mg, or Be as a p-type dopant is doped in the upper waveguiding layer 208 at about $5 \times 10^{17}$ $cm^{-3}$. The lower waveguiding layer 204 and the upper waveguiding layer 208 are either doped with n- and p-type dopants, respectively, or remained undoped. To form an ohmic electrode, the contact layer 210 is doped at a high concentration of, i.e., $5 \times 10^{19}$ cm$^{-3}$ or more of a p-type dopant such as Zn.

This example has been described by taking the GaAs (311)B substrate as an example. However, it is also possible to form the quantum disk structure discussed above and to perform planarization using the semiconductor carrier blocking layer and the optical waveguiding layer formed on the disk structure by using the surface with another orientation in which the ratio of the (100) surface to the (111)B surface is different, e.g., the (211)B, (411)B, (511)B, (611)B, or (711)B surface.

Figure 22:
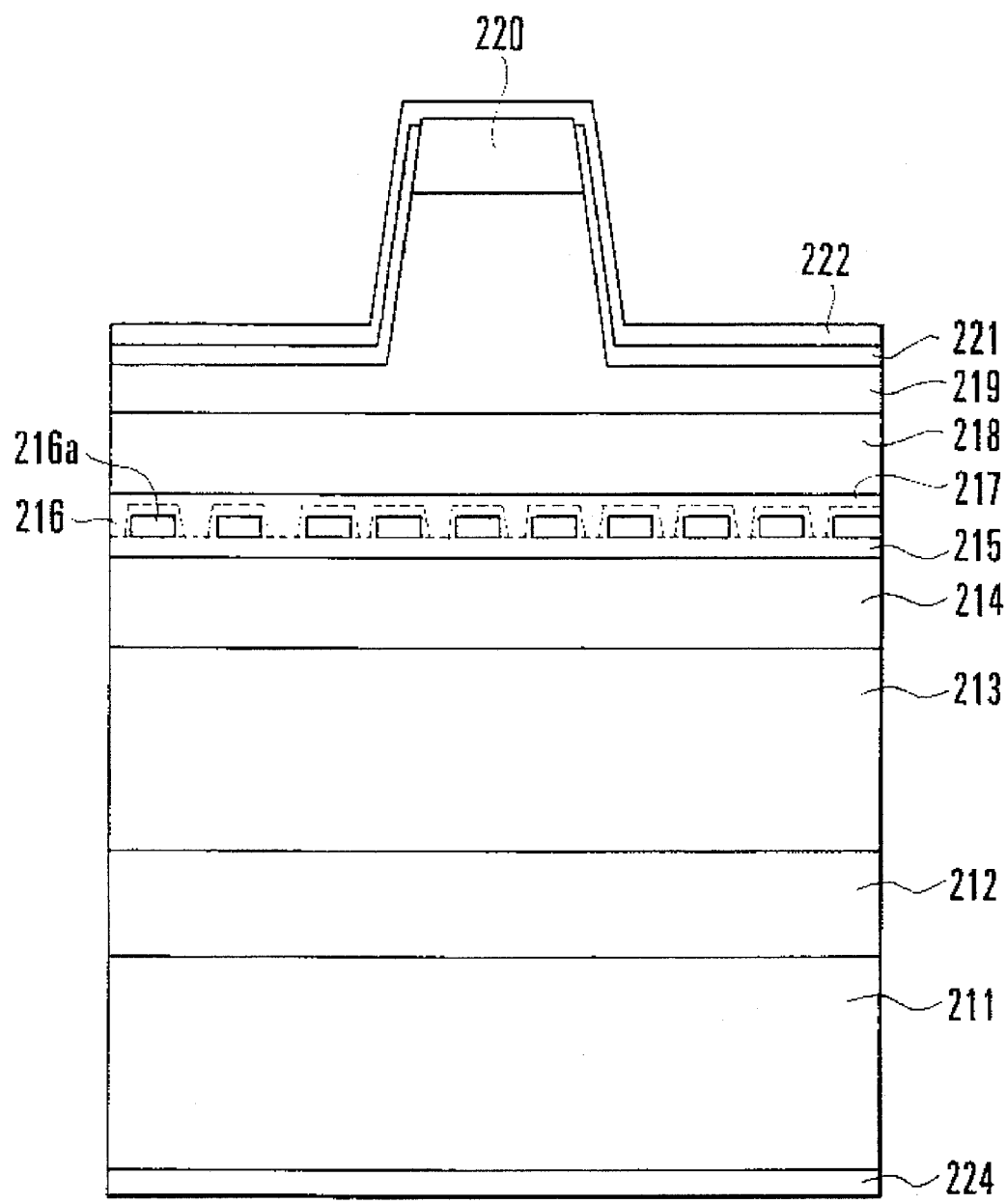
FIG. 22 is a sectional view showing one embodiment of a semiconductor laser according to the present invention.

FIG. 22 shows a ridge laser structure as a representative example of a GaAs refractive index waveguide laser using a strained quantum well film laser epitaxial film. Reference numeral 211 denotes an n$^+$-GaAs substrate; 212, an n$^+$-GaAs buffer layer; 213, a lower n-Al$_x$Ga$_{1-x}$As cladding layer; 214 and 218, Al$_z$Ga$_{1-z}$As waveguiding layers; 215 and 217, an Al$_s$Ga$_{1-s}$As carrier blocking layer and an optical waveguiding layer; 216, a strained In$_y$Ga$_{1-y}$As quantum well film layer; 218, an upper p-Al$_z$Ga$_{1-z}$As waveguiding layer; 219, an upper p-Al$_x$Ga$_{1-x}$As cladding layer; 220, a p$^+$-GaAs contact layer; 221, a passivation film; 222, p-type electrode; and 224, an n-type electrode.

After the crystal growth, the contact layer 220 and the cladding layer 219 are processed to form a ridge about 1.5 to 3 μm in width as illustrated in FIG. 22. For this purpose, a resist is patterned by photolithography and used as a mask to etch the contact layer 220 and the upper cladding layer 219 by wet or dry etching. The depth is determined within the range over which a high order mode does not appear by taking account of a side mode. In some instances, the etching is proceeded to the waveguiding layer 218. After the ridge is formed, the resist mask is removed, and the passivation film 221 (e.g., SiO$_2$) is formed on the entire surface. After a portion of SiO$_2$ on top of the ridge corresponding to an electrode is etched off, the p-type electrode 222 composed of Cr/Au or Ti/Pt/Au is formed. After the thickness of the substrate is reduced, the n-type electrode 224 composed of, e.g., AuGeNi is formed on the lower surface of the substrate. Thereafter, ohmic sintering is performed to complete the ridge laser structure in FIG. 22.

Figure 23A:
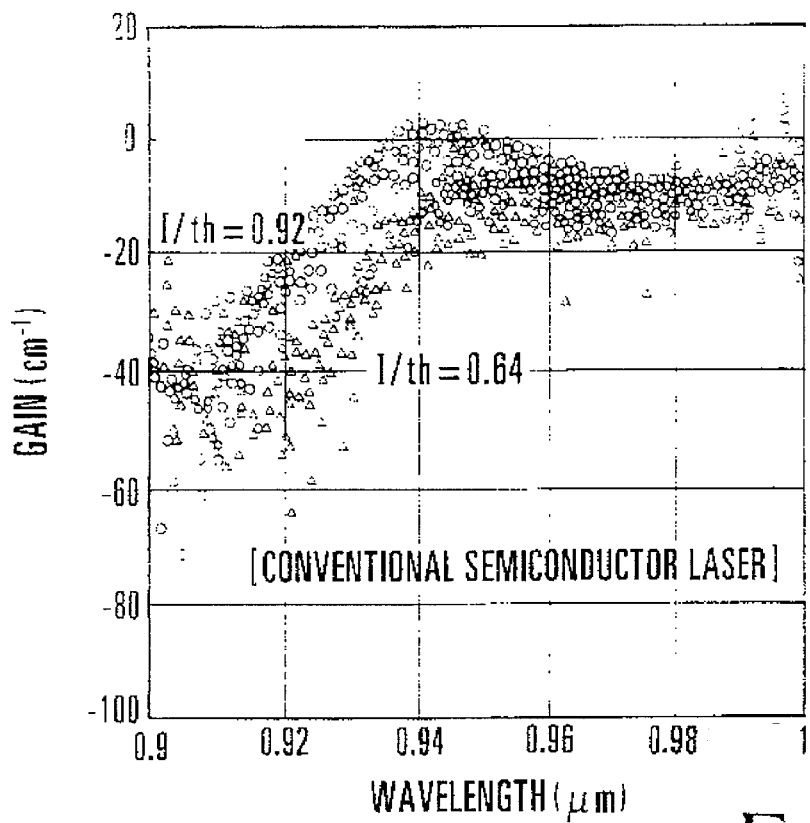
FIGS. 23A and 23B are graphs showing the characteristics of the gain spectrum of a conventional laser and those of the laser of the present invention, respectively.
Figure 23B:
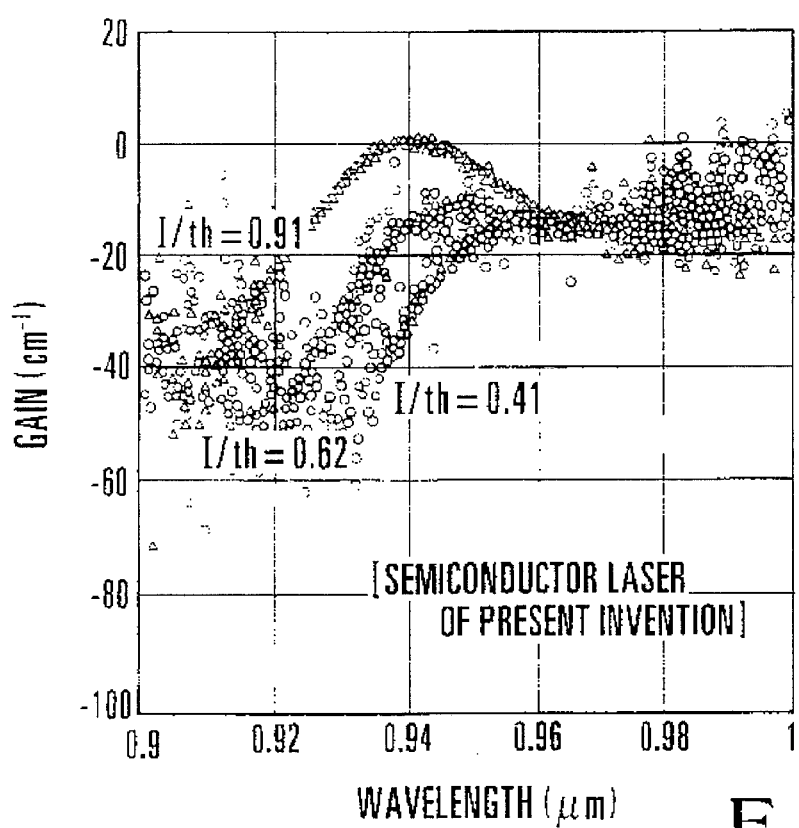

With this structure, it is possible to obtain photoluminescence (PL) with a narrow full-width half maximum which is unique to the quantum effect. PL from a properly grown quantum disk structure has a full-width half maximum which is ½ to ⅓ that of a (100) substrate and a luminescence intensity which is 2 to 5 times higher than that of a (100) substrate. This indicates that islands, i.e., quantum disks are naturally formed very uniform, and their density is high. Also, this PL is more intense than PL of a low-dimensional quantum structure processed by conventional methods or PL obtained by conventional selective growth. As a result, the semiconductor laser of the present invention showed sharp gain spectra. FIGS. 23A and 23B illustrate the gain spectra of a conventional InGaAs strained quantum well film laser and the gain spectra of a strained quantum well film laser according to the present invention, respectively. As can be seen from FIGS. 24A and 24B, the strained quantum well film laser of the present invention exhibits sharp gain spectra compared to those of the conventional example.

Figure 24:
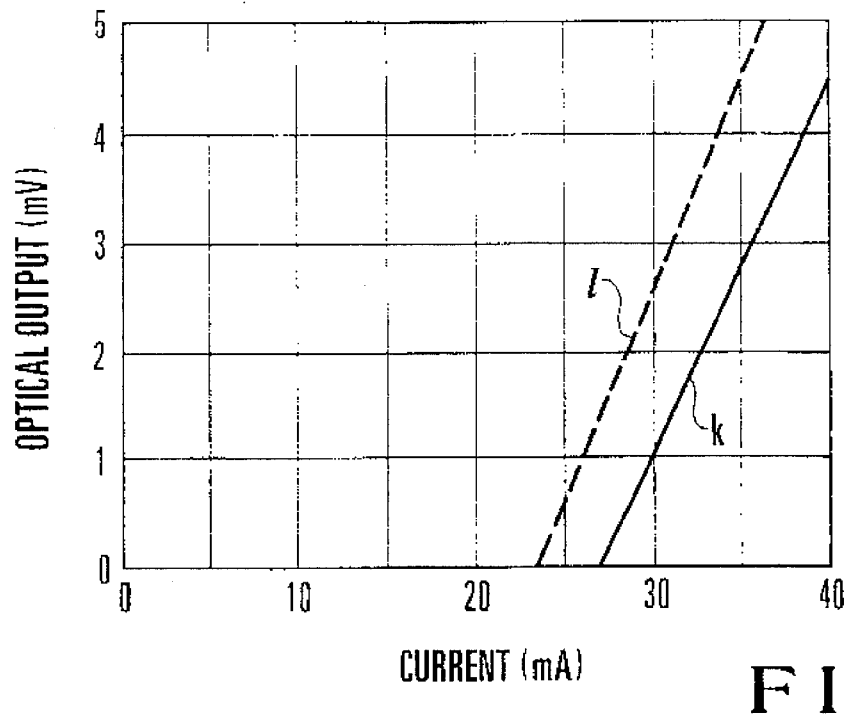
FIG. 24 is a graph showing the optical characteristics of a conventional InGaAs strained quantum well film laser and those of an InGaAs strained quantum well film laser of the present invention.
Figure 25:
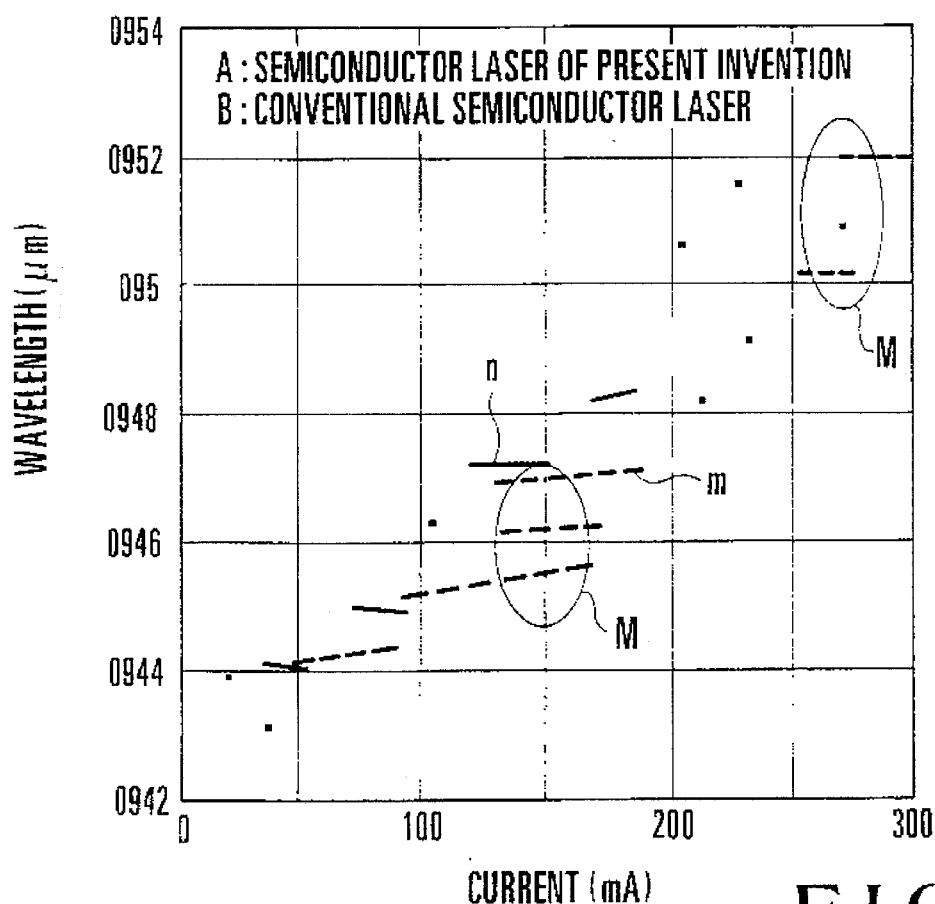
FIG. 25 is a graph showing the current value dependency of a conventional InGaAs strained quantum well film laser and that of an InGaAs strained quantum well film laser of the present invention.

An improvement was also found in the threshold current. FIG. 24 shows an optical output characteristic curve k of a conventional InGaAs strained quantum well film laser and an optical output characteristic curve l of the strained quantum well film laser according to the present invention. It is apparent from FIG. 24 that the threshold current is improved. FIG. 25 shows the injection current dependency m of the oscillation wavelength of a conventional InGaAs strained quantum well film laser and the injection current dependency n of the lasing wavelength of the strained quantum well film laser according to the present invention. The strained quantum well film laser of the present invention lases in a single mode in the overall current region observed, whereas the conventional InGaAs strained quantum well film laser tended to lase in a multimode in a current region in which the mode jump occurred. That is, the strained quantum well film laser of the present invention exhibited a good lasing stability. The effectiveness of the novel quantum well film laser of the present invention was thus confirmed.

In the fabrication of conventional low-dimensional semiconductor structures, a process is complicated in processing a quantum well film layer by etching. In addition, a quantum well film layer is damaged when processed by dry etching, and is side-etched when processed by wet etching. This lack of controllability leads to size fluctuation or the like. The semiconductor laser of the present invention can solve these conventional problems.

Furthermore, in a conventional method of fabrication in which a fine mask of SiO$_2$ or the like is formed beforehand on a semiconductor substrate and selective growth by an MOVPE method or the like is used, a process of substrate preparation is complicated. Also, the method requires the steps of mask removal and regrowth when applied to the fabrication of lasers. This leads to drawbacks such as an increase in the number of fabrication steps, inevitable introduction of damage, and a low productivity. The semiconductor laser of the present invention can also solve these conventional problems.

Moreover, in a conventional method of forming a quantum structure on a compound semiconductor substrate whose surface is a high-index-number surface by using only vapor phase growth, the surface flatness is also degraded with the growth. Therefore, when a laser is fabricated by growing an optical waveguiding layer and an optical cladding layer on this semiconductor disk structure, a distribution of refractive index derived from the disk shape takes place. This scattering may result in an increase in loss. The semiconductor laser of the present invention can also solve this problem by adjusting the composition of the barrier layer. This makes it possible to improve the characteristics of a semiconductor laser by using the low-dimensional quantum effect.

In the structures in FIGS. 20 and 22, only island regions are formed as the semiconductor carrier confinement layer. However, it is of course possible to form a structure in which individual island regions are connected by a thin quantum well film.

It was confirmed that in the above optical semiconductor lasers, the lasing efficiency was higher when the semiconductor carrier confinement layer was constituted by the combination of a large number of islands and a thin quantum well film. This is because carriers injected into the thin quantum well film diffuse into the individual island regions without causing any non-radiative recombination, and this contributes to luminescence recombination in the island regions. If only island regions are formed, only carriers within the respective diffusion lengths from the island regions contribute to the lasing. Therefore, the resulting lasing efficiency is low compared to that obtained by the combination of a thin quantum well film and island regions.

The present invention is not limited to the above examples but can be carried out in the form of various modifications.

Figure 26A:
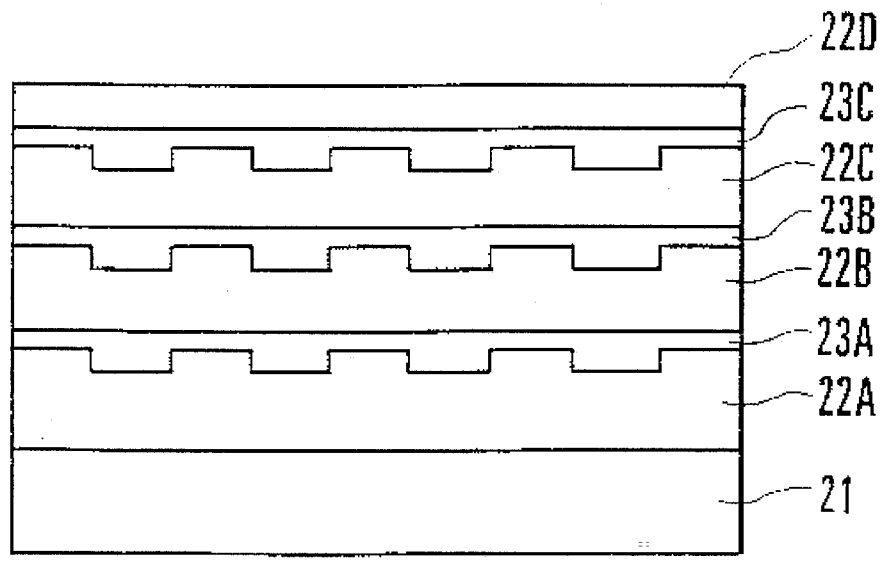
FIGS. 26A and 26B are sectional views showing still other modifications of the present invention.
Figure 26B:
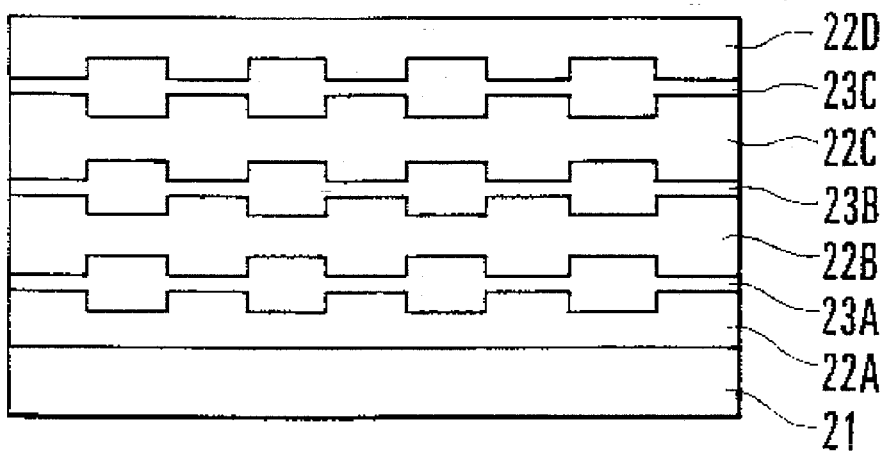
Figure 27A:
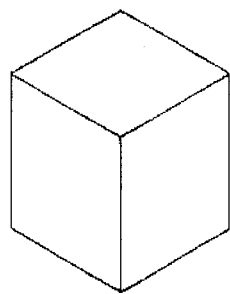
FIGS. 27A to 27H are views showing the arrangements of a bulk structure, a quantum well film structure, a quantum wire structure, and a quantum box structure, and graphs for explaining the spectra of the density of states of these structures.
Figure 27B:
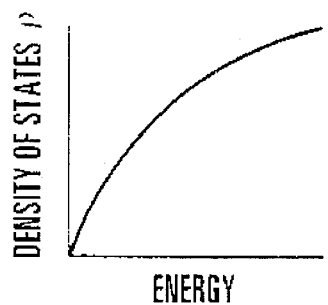
Figure 27C:
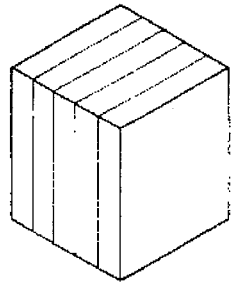
Figure 27D:
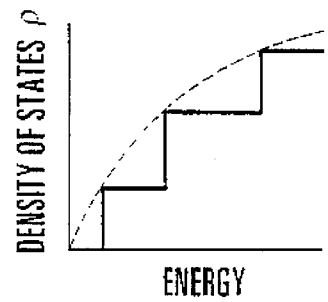
Figure 27E:
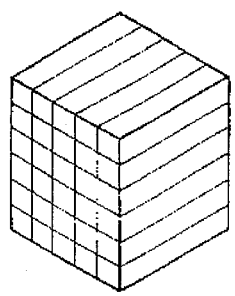
Figure 27F:
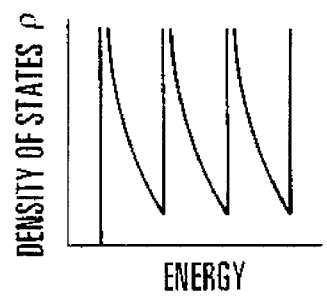
Figure 27G:
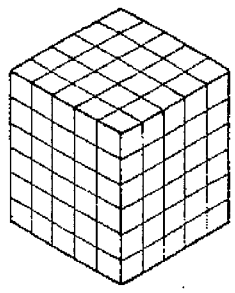
Figure 27H:
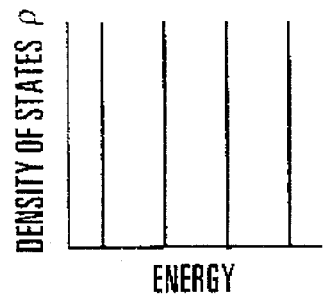

Examples are structures in FIGS. 26A and 26B which are modifications of the structure illustrated in FIG. 2. The same reference numerals as in FIG. 2 denote the same parts or parts having the same functions in FIGS. 26A and 26B. FIG. 26A shows the structure in which island regions 25 are formed downward from a thin quantum well film 24. FIG. 26B shows the structure in which the island regions 25 are formed above and below the thin quantum well film 24.

According to the present invention as has been discussed above, a semiconductor barrier layer is formed on a semiconductor substrate with a high-index-number surface by vapor phase crystal growth. Subsequently, a strained quantum well film having lattice mismatch with the barrier layer is formed to have a certain film thickness on the semiconductor barrier layer by vapor phase crystal growth under a certain condition. After the growth of this strained quantum well film, a growth interruption time is taken to facilitate the aggregation of the film into islands, thereby forming an island structure on the strained quantum well film. In this manner, it is possible to obtain, on the substrate without any patterning process, an island region for an optical semiconductor device which is a semiconductor quantum structure having the strained quantum well film on which fine islands are formed with a high uniformity and a high density.

In addition, the present invention uses the steps of forming a semiconductor barrier layer on a semiconductor substrate with a high-index-number surface by vapor phase crystal growth, forming a strained quantum well film layer having lattice mismatch with the barrier layer by vapor phase crystal growth, forming islands by aggregation of the strained quantum well film layer into islands and the mass transport of the lower barrier layer by performing growth interruption after the growth of the strained quantum well film layer, and forming an upper semiconductor barrier layer on the islands by vapor phase crystal growth. Consequently, it is possible to form an optical semiconductor device island region, in which fine semiconductor islands are formed with a high uniformity and a high density, on the substrate without any patterning process.

In the semiconductor quantum structure fabricated in this manner, a plurality of the island structures of the carrier confinement layers can be stacked in the direction of thickness by repeating the process to form one layer of the carrier confined structure of the present invention. This makes a high-density semiconductor quantum structure feasible. That is, these semiconductor quantum structures realize low-dimensional quantum structures which confine carriers and show strong luminescence. Therefore, these semiconductor quantum structures can be applied to semiconductor lasers, optical modulators, or semiconductor optical nonlinear devices on a practical level.

What is claimed is:

1. A method of fabricating a semiconductor structure, comprising:

the first step of forming a first semiconductor barrier layer on a substrate having an (n11)B surface (n= 2, 3, 4, 5, 6, or 7) as a major surface and comprising a III–V compound semiconductor by using vapor phase crystal growth;

the second step of forming a strained quantum well film with lattice mismatch on said semiconductor barrier layer by vapor phase crystal growth;

the third step of interrupting the growth of said strained quantum well film for a time after the second step to facilitate the transfer of said strained quantum well film layer to island regions, thereby forming a carrier confinement layer having an island structure consisting of a plurality of islands with a relatively large film thickness on said strained quantum well film; and the fourth step of forming a second semiconductor barrier layer on said carrier confinement layer by vapor phase crystal growth.

2. A method according to claim 1, further comprising:

the fifth step of forming a second strained quantum well film with lattice mismatch on said second semiconductor barrier layer by vapor phase crystal growth;

the sixth step of interrupting the growth of said second strained quantum well film for a time after the fifth step to facilitate the transfer of said second strained quantum well film to island regions, thereby forming a carrier confinement layer having an island structure consisting of a plurality of islands with a relatively large film thickness on said second strained quantum well film; and the seventh step of forming a semiconductor barrier layer on said carrier confinement layer by vapor phase crystal growth subsequently to the sixth step.

3. A method of fabricating a semiconductor structure, comprising:

the first step of forming a semiconductor barrier layer on a substrate having an (n11)B surface (n =2, 3, 4, 5, 6, or 7) as a major surface and comprising a III–V compound semiconductor by using vapor phase crystal growth;

the second step of forming a strained quantum well film layer with lattice mismatch on said semiconductor barrier layer by vapor phase crystal growth;

the third step of interrupting the growth of said strained quantum well film layer after the second step to facilitate the transfer of said strained quantum well film layer to island regions and said semiconductor barrier layer below said strained quantum well film layer, thereby forming a semiconductor carrier confinement layer having an island structure in which said strained quantum well film layer breaks up into a plurality of islands and said islands are completely surrounded by said semiconductor barrier layer; and the fourth step of forming a second barrier layer on said semiconductor carrier confinement layer by vapor phase crystal growth subsequently to the third step.

4. A method according to claim 3, further comprising:

the fifth step of forming a second strained quantum well film layer with lattice mismatch on said second semiconductor barrier layer by vapor phase crystal growth;

the sixth step of facilitating the transfer of said second strained quantum well film layer to island regions and said semiconductor barrier layer below said second strained quantum well film layer after the fifth step, thereby forming a semiconductor carrier confinement layer having an island structure in which said strained quantum well film layer breaks up into a plurality of islands and said islands are completely surrounded by said semiconductor barrier layer; and the seventh step of forming a semiconductor barrier layer on said semiconductor carrier confinement layer by vapor phase crystal growth subsequently to the sixth step.

* * * * *

UNITED STATES PATENT AND TRADEMARK OFFICE
CERTIFICATE OF CORRECTION

PATENT NO. : 5,543,354
DATED : August 6, 1996
INVENTOR(S) : Richard Nötzel, Jiro Temmyo and Toshiaki Tamamura It is certified that error appears in the above-indentified patent and that said Letters Patent is hereby corrected as shown below:

On the title page:
Inventors: Richard Nötzel, of Berlin, Germany; Jiro Temmyo, of Kanagawa, Japan; and Toshiaki Tamamura, of Kanagawa, Japan Signed and Sealed this Twenty-third Day of September, 1997

*Attest:*

BRUCE LEHMAN

*Attesting Officer*     Commissioner of Patents and Trademarks